(12) United States Patent
Jeon et al.

(10) Patent No.: US 11,301,071 B2
(45) Date of Patent: Apr. 12, 2022

(54) DISPLAY DEVICE

(71) Applicant: Samsung Display Co., LTD., Yongin-si (KR)

(72) Inventors: Myoung Ha Jeon, Asan-si (KR); Seong Sik Ahn, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/817,056

(22) Filed: Mar. 12, 2020

(65) Prior Publication Data

US 2020/0310577 A1 Oct. 1, 2020

(30) Foreign Application Priority Data

Mar. 25, 2019 (KR) .................. 10-2019-0033716

(51) Int. Cl.
*G06F 3/041* (2006.01)
*H01L 27/32* (2006.01)
(Continued)

(52) U.S. Cl.
CPC .......... *G06F 3/0412* (2013.01); *H01L 27/323* (2013.01); *H01L 27/3244* (2013.01);
(Continued)

(58) Field of Classification Search
CPC . H01L 51/0091; H01L 51/5246; H01L 51/56; H01L 27/3276; H01L 27/3244; H01L 27/323; H01L 2251/566; G06F 3/0412; G06F 3/0446; G06F 3/0443; G06F 3/04164; G06F 3/044; G06F 3/0445; G06F 2203/04102; G06F 2203/04111; G06F 2203/04112; G06F 2203/04107;
(Continued)

(56) References Cited

U.S. PATENT DOCUMENTS

2008/0158181 A1* 7/2008 Hamblin ............. G06F 3/04164
345/173
2011/0045258 A1* 2/2011 Jahromi ................ C23C 14/024
428/209

(Continued)

FOREIGN PATENT DOCUMENTS

KR 10-2017-0116303 10/2017
KR 10-1844432 4/2018
KR 10-2018-0066378 6/2018

*Primary Examiner* — Dong Hui Liang
(74) *Attorney, Agent, or Firm* — Kile Park Reed & Houtteman PLLC

(57) ABSTRACT

A display device includes a display panel having a display surface, the flexible substrate including a first flat portion, a second flat portion disposed to overlap the first flat portion in a thickness direction of the display device, and a bending portion between the first flat portion and the second flat portion; a touch panel disposed on the display panel, and including a pad side portion; a touch printed circuit board including a first attachment portion attached to a surface of the pad side portion; and a first support film disposed to overlap the first flat portion, and a second support film disposed to overlap the second flat portion, wherein the first support film includes a first indent pattern indented inwardly of the bending portion and from a remaining portion of the first support film.

24 Claims, 19 Drawing Sheets

(51) Int. Cl.
  *H01L 51/00*   (2006.01)
  *H01L 51/52*   (2006.01)
  *H04M 1/02*    (2006.01)

(52) U.S. Cl.
  CPC ............... *H01L 51/0097* (2013.01); *G06F 2203/04102* (2013.01); *G06F 2203/04107* (2013.01); *H01L 2251/5338* (2013.01); *H04M 1/0268* (2013.01)

(58) Field of Classification Search
  CPC .... G06F 1/1626; G06F 1/1652; G06F 1/1637; G06F 1/1643; G06F 1/1684; G09F 9/301
  See application file for complete search history.

(56) References Cited

U.S. PATENT DOCUMENTS

| | | | |
|---|---|---|---|
| 2014/0126228 A1* | 5/2014 | Lee | F21V 21/00 362/382 |
| 2016/0179139 A1* | 6/2016 | Ahn | G06F 1/1637 361/679.3 |
| 2016/0190510 A1* | 6/2016 | Li | H01L 25/165 257/40 |
| 2017/0047357 A1* | 2/2017 | Kwak | H01L 51/0097 |
| 2017/0150604 A1* | 5/2017 | Tsai | H05K 1/144 |
| 2018/0047802 A1* | 2/2018 | Yoon | H01L 27/3262 |
| 2019/0198801 A1* | 6/2019 | Kuon | H01L 51/5253 |
| 2020/0154581 A1* | 5/2020 | Chen | G06F 3/04164 345/173 |

* cited by examiner

DISPLAY DEVICE

CROSS-REFERENCE TO RELATED APPLICATION

This application claims priority from Korean Patent Application No. 10-2019-0033716, filed on Mar. 25, 2019 in the Korean Intellectual Property Office, and all the benefits accruing therefrom under 35 U.S.C. 119, the contents of which in its entirety are herein incorporated by reference.

BACKGROUND

1. Technical Field

The disclosure relates generally to a display device, and more specifically, to a configuration therefor that prevents disconnection of electrical wirings of a display device when a bending portion thereof is subjected to an impact.

2. Description of the Related Art

Generally a display device includes a display panel for displaying an image, and the display panel may be an organic light emitting display panel or a liquid crystal display panel. A window for protecting the display panel from an external impact is widely used with portable electronic devices, such as smart phones. Some of these portable electronic devices include a touch input function. Such a display device may include a touch panel that performs the touch input function. The above-mentioned window, touch panel and display panel may be attached to each other through an adhesive.

Each of the touch panel and the display panel may receive an external signal through a printed circuit film or the like attached to a connection portion.

Meanwhile, the display panel may include a flexible substrate including a bending portion which is bent in a direction opposite to a display surface of the display panel, and flat portions formed with the bending portion interposed therebetween. Further, the display device may include support films disposed to overlap the flat portions.

In the above display device, a bending stress may become concentrated on a region of the display panel that contacts an end portion of the support films. Such an occurrence of that bending stress may cause portions of the electrical wirings of the device to experience cracks therein which may lead to disconnection of electrical wirings required to enable the display panel to function properly.

SUMMARY

Embodiments herein are directed to a display device and configuration therefor that prevents disconnection of electrical wirings of a display device when a bending portion thereof is subjected to an impact.

According to an exemplary embodiment of the disclosure, there is provided a display device including a display panel including a flexible substrate having a display surface, and the flexible substrate including a first flat portion, a second flat portion disposed to overlap the first flat portion in a thickness direction of the display device, and a bending portion between the first flat portion and the second flat portion; a touch panel being disposed on the display panel, and including a pad side portion; a touch printed circuit board including a first attachment portion attached to a first surface of the pad side portion; and in the thickness direction, a first support film disposed to overlap the first flat portion and a second support film disposed to overlap the second flat portion, wherein the first support film includes a first indent pattern which is indented inwardly of the bending portion and from a remaining portion of the first support film.

In an embodiment, the touch printed circuit board is bent in a direction opposite to a display surface to cover the bending portion, the display device further includes a first bending stress relieving layer covering a lower surface of the first attachment portion exposed by the touch panel.

In an embodiment, the display device further comprises an optical film disposed between the touch panel and the flexible substrate; and a bending protective film disposed on a side of the optical film to cover the bending portion, wherein the first support film disposed to overlap at least a portion of each of the bending protective film and the optical film.

In an embodiment, the first support film and the second support film face each other, and the display device further comprises a bonding layer disposed between the first support film and the second support film.

In an embodiment, the display device further includes a metal layer disposed between the bonding layer and the first support film and over the first flat portion, the bending portion and the second flat portion.

In an embodiment, the touch printed circuit board includes first attachment portions, and the first support film includes first indent patterns respectively disposed to overlap the first attachment portions.

In an embodiment, the touch printed circuit board further includes a second attachment portion attached to a second surface of the pad side portion, and is disposed between the first attachment portions.

In an embodiment, the first support film includes a second indent pattern disposed to overlap the second attachment portion in the thickness direction, the second indent pattern being indented inwardly of the bending portion and from a remaining portion of the first support film.

In an embodiment, the display device further includes a second bending stress relieving layer covering a surface of the second attachment portion exposed by the touch panel.

In an embodiment, a width of the first attachment portion in a first direction is less than a width of the first indent pattern in the first direction, and the first direction intersects a direction in which the first flat portion is viewed from the bending portion.

In an embodiment, a planar shape of the first indent pattern includes a curved shape.

In an embodiment, a side surface of the first support film is disposed more inwardly of the bending portion than is a side surface of the second support film.

In an embodiment, the second support film includes a second indent pattern indented inwardly of the bending portion and from a remaining portion of the second support film.

In an embodiment, a side surface of the first support film is aligned with a side surface of the second support film.

In an embodiment, the display device further includes a display printed circuit board attached to the second flat portion of the display panel, and a main circuit board electrically connecting the display printed circuit board to the touch printed circuit board.

According to an exemplary embodiment of the a display device includes a display panel including a flexible substrate including a first flat portion, a second flat portion disposed to overlap the first flat portion in a thickness direction of the display device, and a bending portion located between the first flat portion and the second flat portion; a touch panel disposed on the display panel; a cover window disposed on the touch panel; and a first support film disposed to overlap the first flat portion and a second support film disposed to overlap the second flat portion to face the first support film, wherein, when viewed in a plan view, an end portion of the first support film includes at least one indent pattern disposed beyond a boundary between the bending portion and the first flat portion.

In an embodiment, the display device further includes a bracket attached to the cover window to cover lower and side surfaces of the display panel and the touch panel.

In an embodiment, the bracket includes at least one protrusion portion protruding toward the touch panel, and the at least one indent pattern is disposed to overlap the at least one protrusion portion.

In an embodiment, the display device further includes an optical film disposed between the touch panel and the flexible substrate; and a protective film disposed on a side of the optical film to cover the bending portion, wherein the first support film is disposed to overlap at least a portion of each of the protective film and the optical film.

In an embodiment, the first support film and the second support film face each other, and the display device further includes a bonding layer disposed between the first support film and the second support film.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

Figure 1:
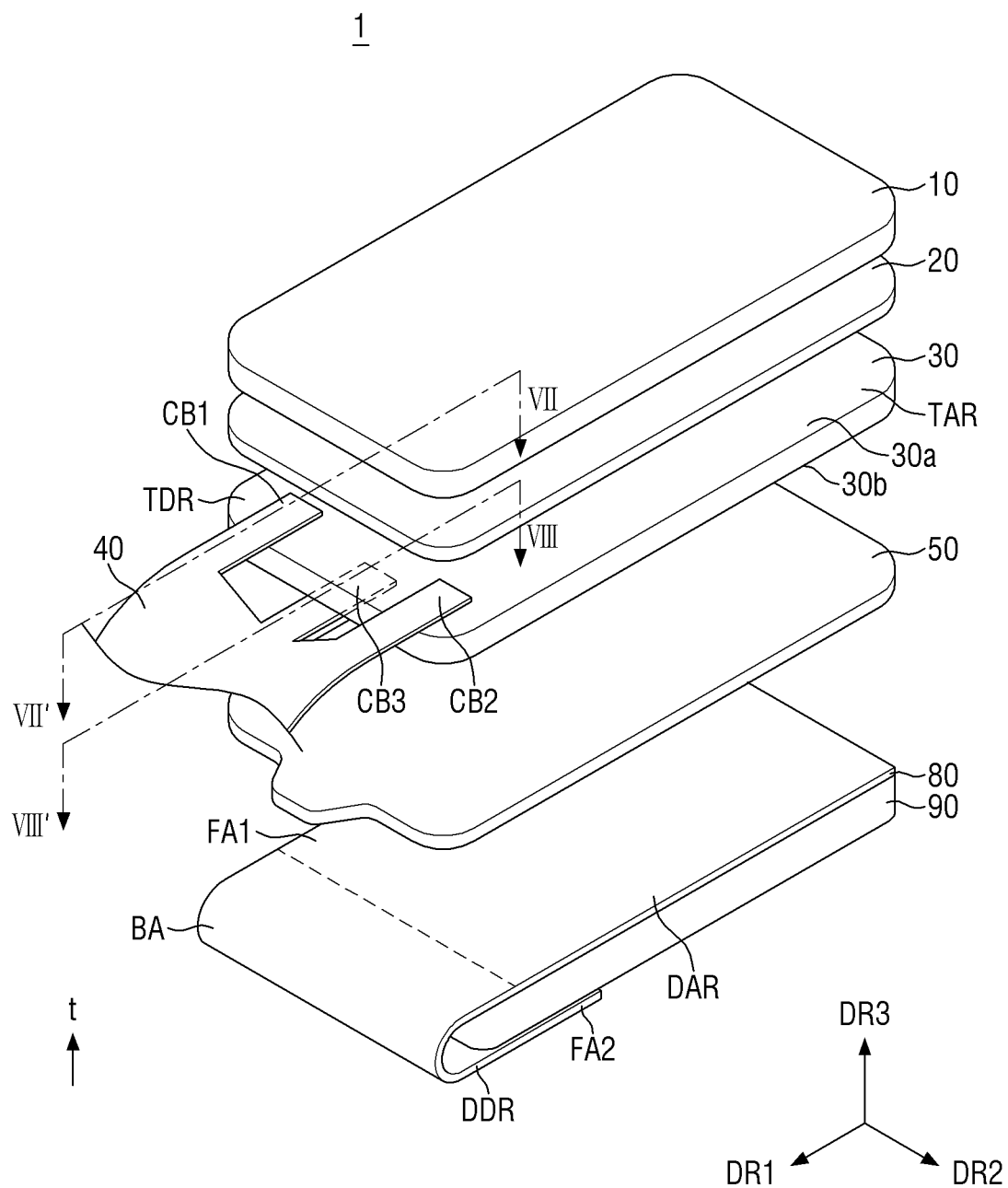
FIG. 1 is an exploded perspective view of a display device according to an embodiment.

An additional appreciation according to the embodiments of the disclosure will become more apparent by describing in detail the embodiments thereof with reference to the accompanying drawings, wherein:

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

The drawings and description are to be regarded as only illustrative in nature, and thus are not limiting of embodiments described and claimed herein. Some of the parts which are not associated with the description may not be provided in order to describe embodiments of the disclosure and like reference numerals refer to like elements throughout the specification.

In the drawings, a size and thickness of each element are arbitrarily represented for better understanding and ease of description, however the disclosure is not limited thereto. In the drawings, the thickness of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below a second object, and vice versa. When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
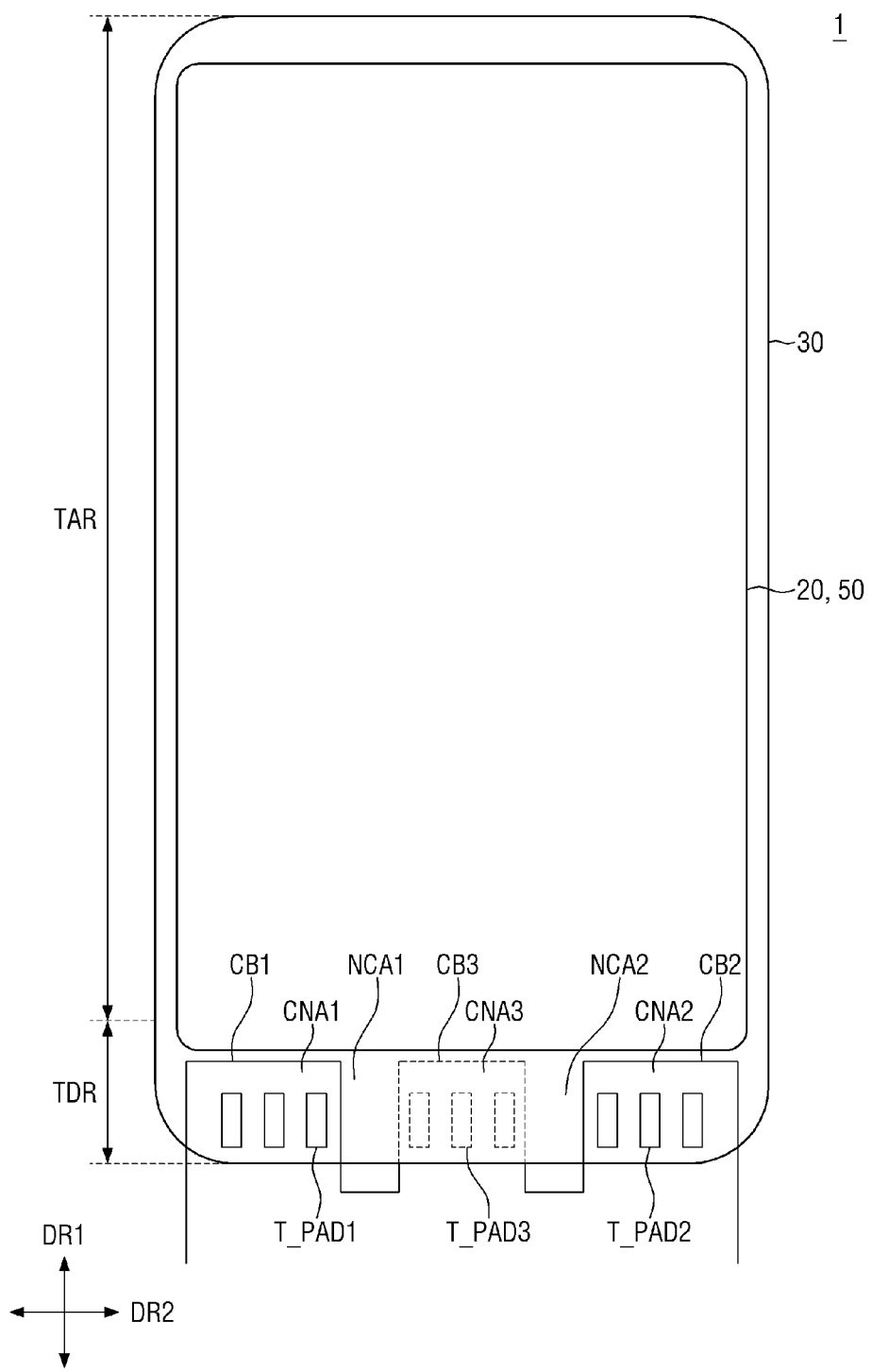
FIG. 2 is a plan layout diagram showing a planar arrangement relationship between a touch panel and a touch printed circuit board.
Figure 3:
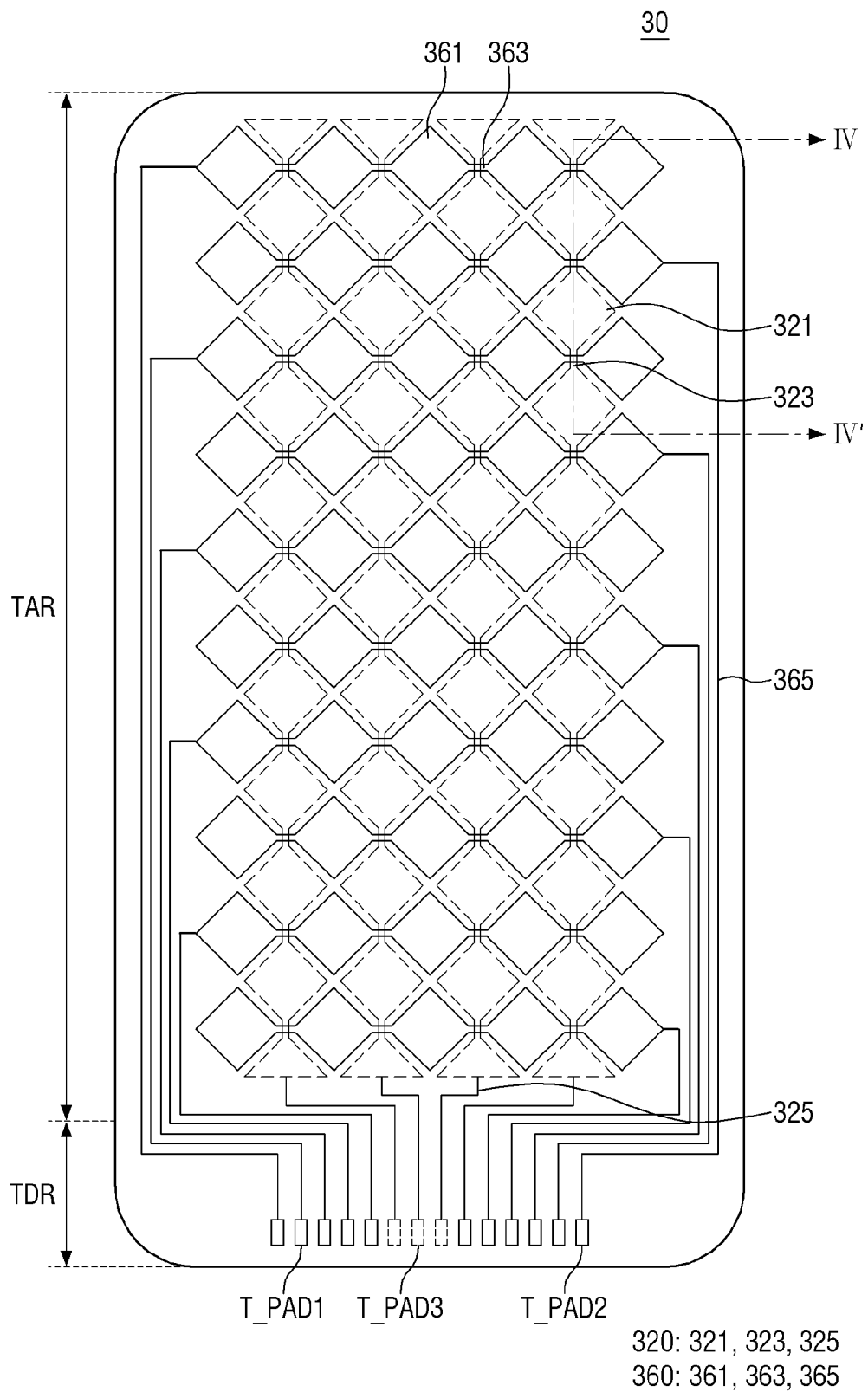
FIG. 3 is a plan layout diagram of a touch panel according to an embodiment.
Figure 4:
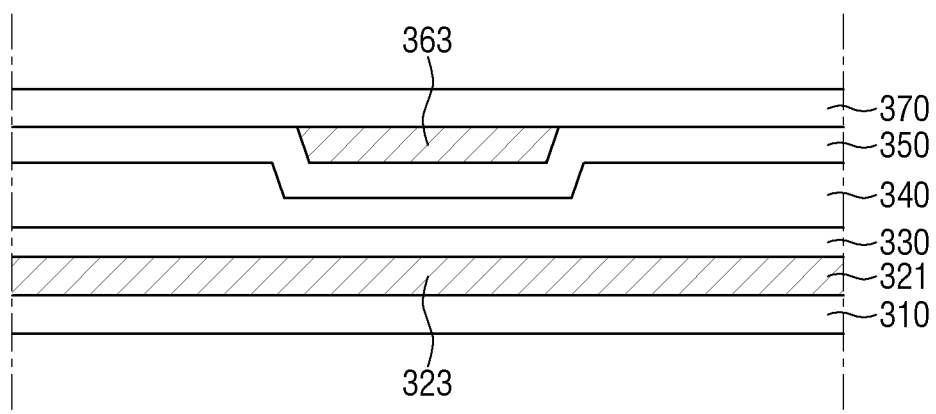
FIG. 4 is a cross-sectional view of a touch panel according to an embodiment taken along line IV-IV' of FIG. 3.
Figure 5:
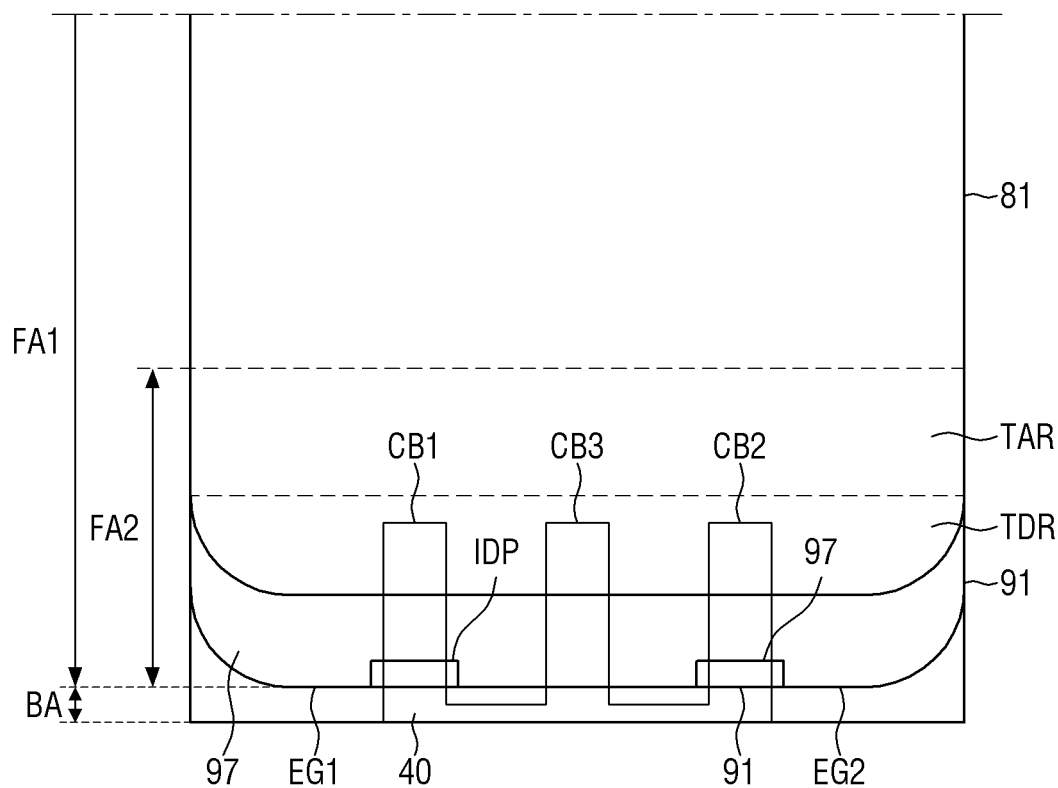
FIG. 5 is a plan layout diagram showing a planar arrangement relationship between first and second support films and a touch printed circuit board.
Figure 5:
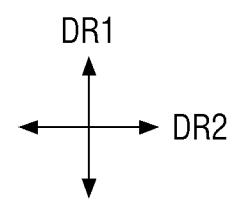
Figure 6:
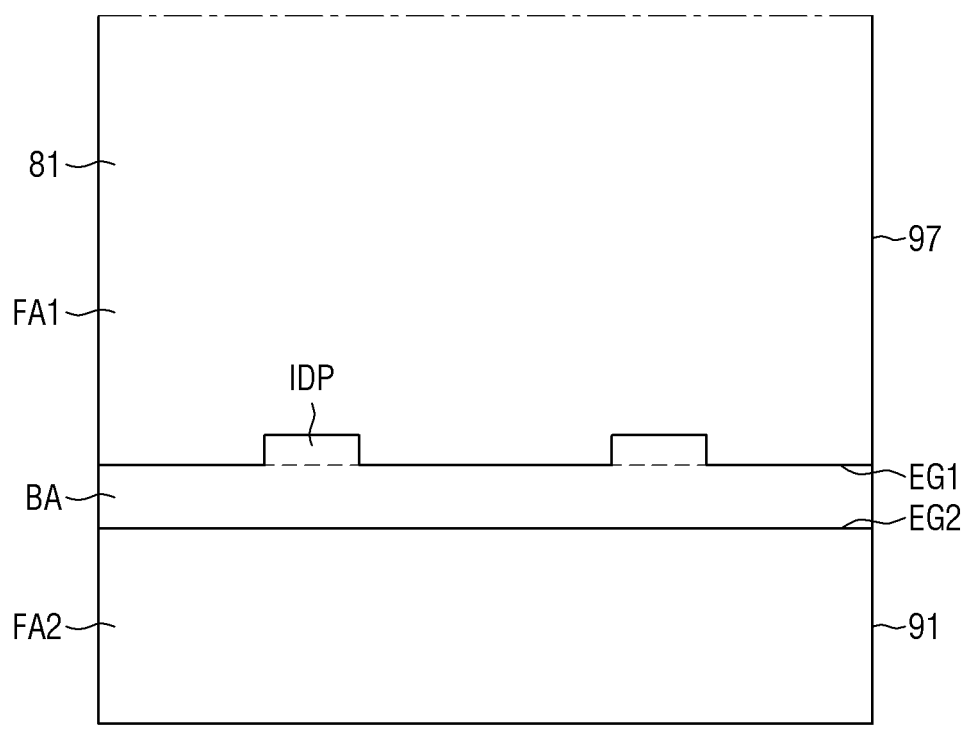
FIG. 6 is a plan layout diagram showing a planar arrangement relationship between first and second support films and a display panel in an unfolded state.
Figure 7:
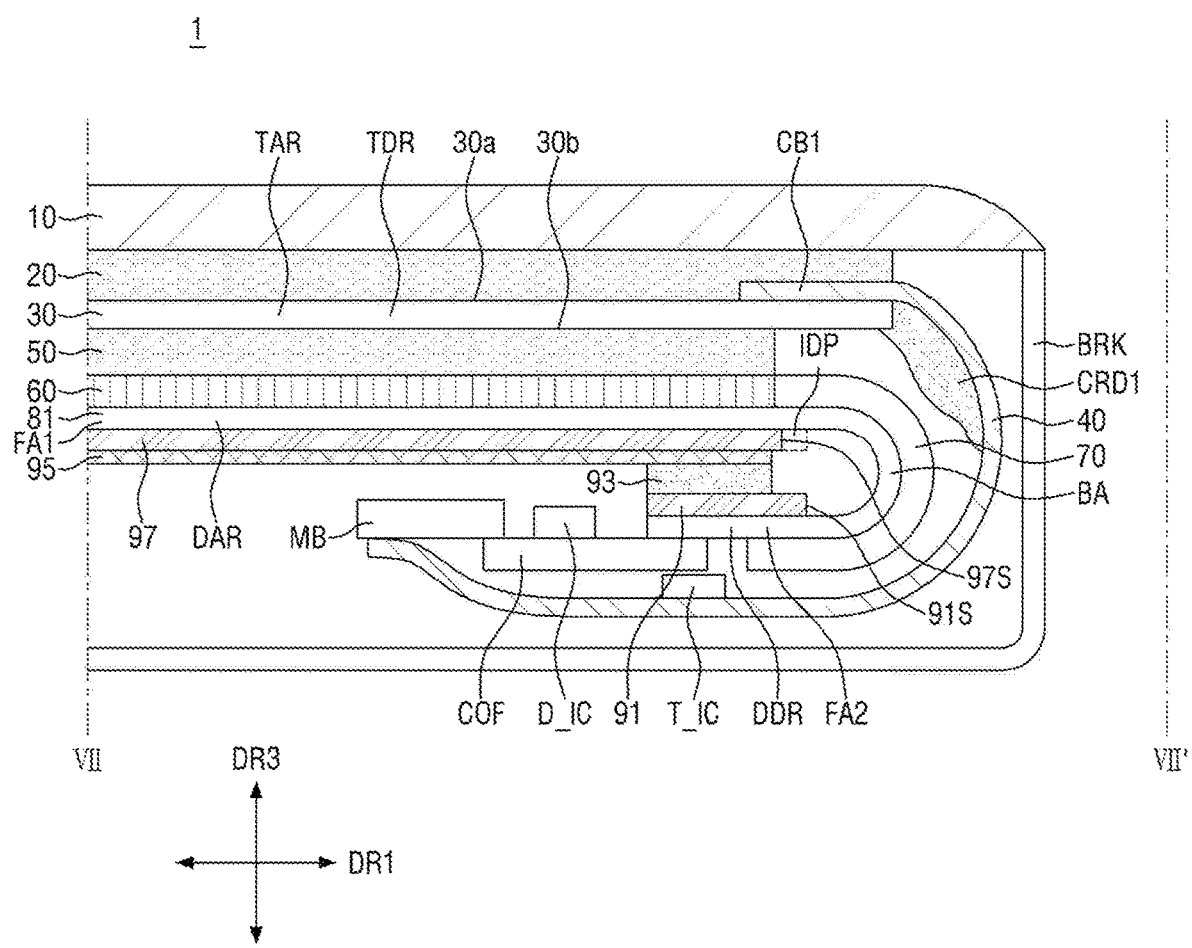
FIG. 7 is a cross-sectional view taken along line VII-VII' of FIG. 1.
Figure 8:
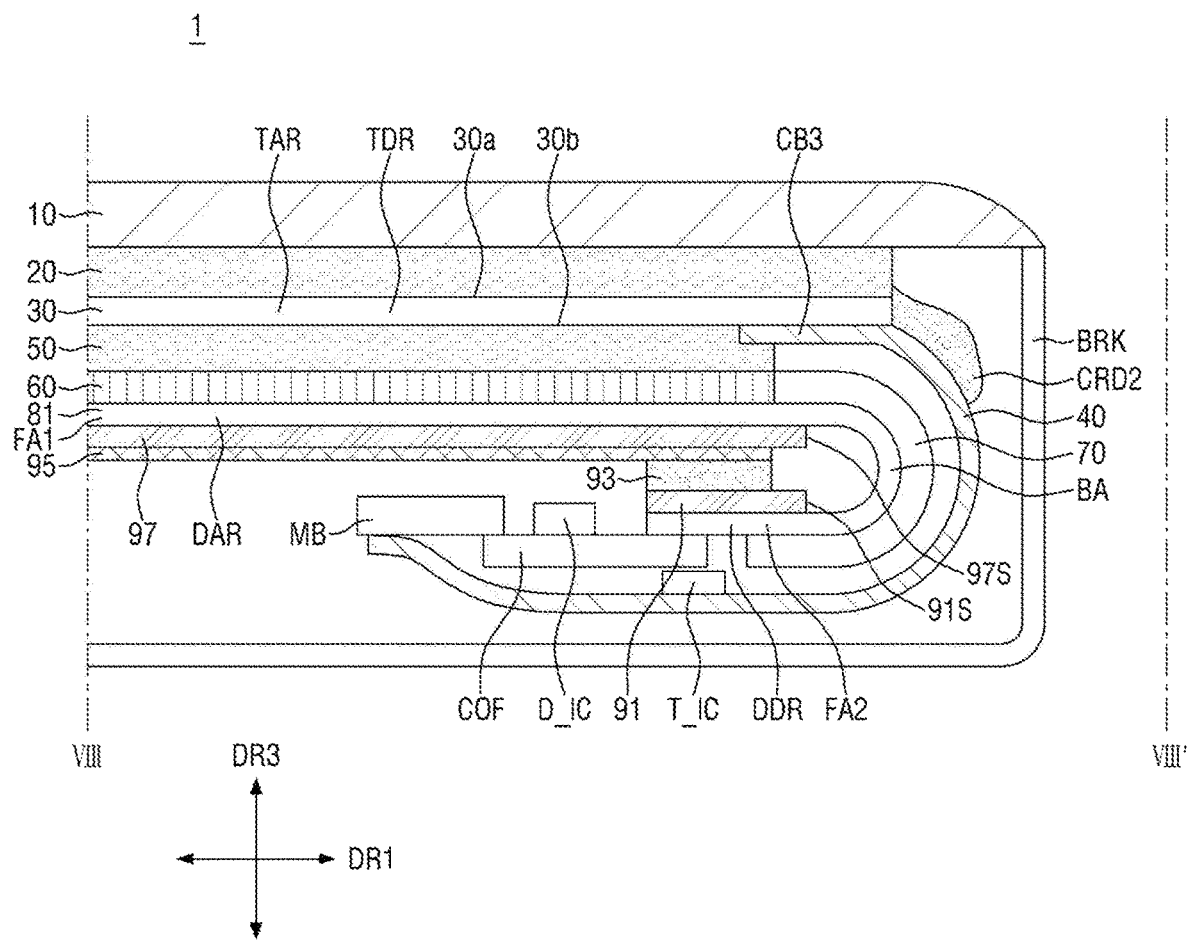
FIG. 8 is a cross-sectional view taken along line VIII-VIII' of FIG. 1.
Figure 9:
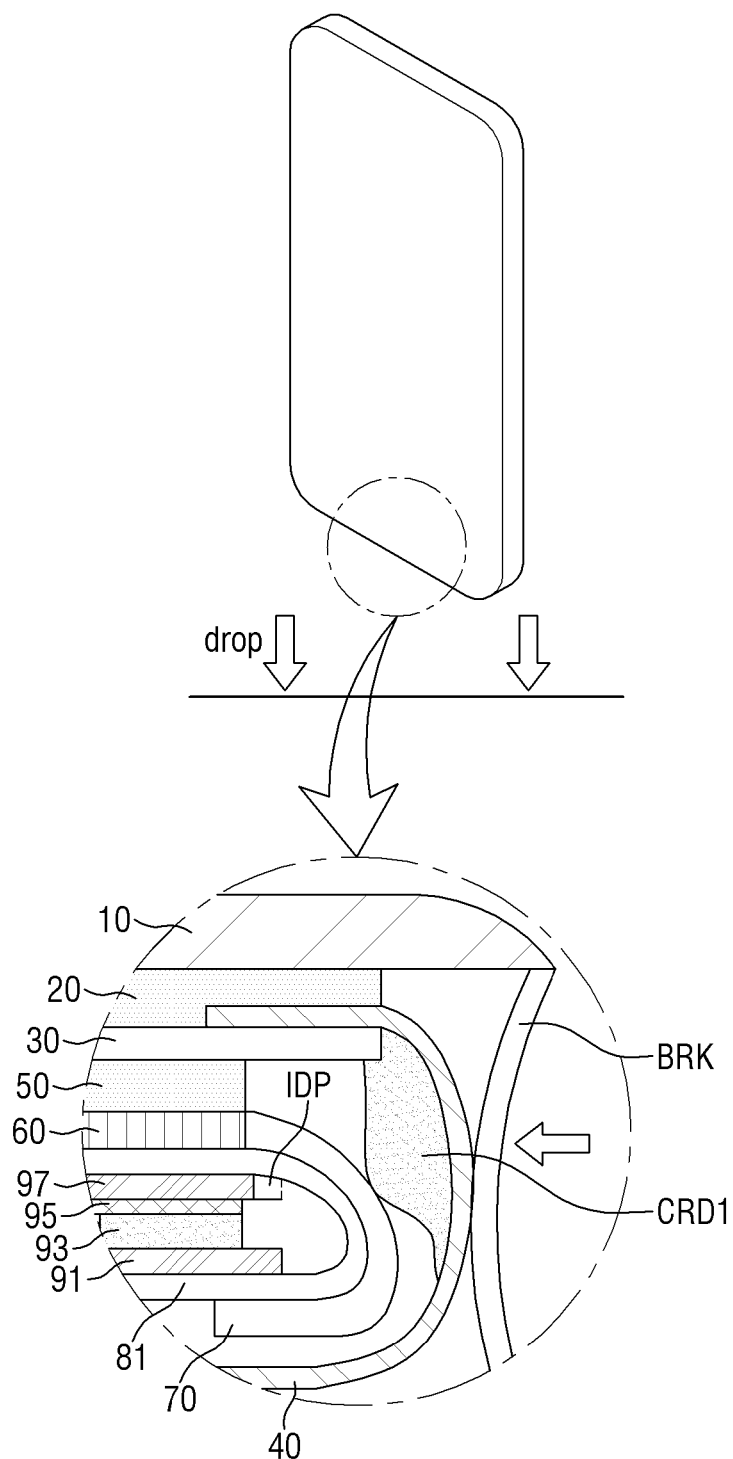
FIG. 9 is a schematic diagram showing a case where an external impact is applied to a display device according to an embodiment, and a partially enlarged cross-sectional view thereof.

FIG. 1 is an exploded perspective view of a display device according to an embodiment. FIG. 2 is a plan layout diagram showing a planar arrangement relationship between a touch panel and a touch printed circuit board. FIG. 3 is a plan layout diagram of a touch panel according to an embodiment. FIG. 4 is a cross-sectional view taken along line IV-IV' of FIG. 3. FIG. 5 is a plan layout diagram showing a planar arrangement relationship between first and second support films and a touch printed circuit board. FIG. 6 is a plan layout diagram showing a planar arrangement relationship between first and second support films and a display panel in an unfolded state. FIG. 7 is a cross-sectional view taken along line VII-VII' of FIG. 1. FIG. 8 is a cross-sectional view taken along line VIII-VIII' of FIG. 1. FIG. 9 is a schematic diagram showing a case where an external impact is applied to a display device according to an embodiment, and a partially enlarged cross-sectional view thereof.

Referring to FIGS. 1 to 9, a display device 1 includes a display panel 80, a touch panel 30, a window 10, a first optically clear adhesive member 20 and a second optically clear adhesive member 50.

The display panel 80 is a panel for displaying an image provided by an input data signal. A panel such as an organic light emitting display panel, a liquid crystal display panel, a plasma display panel and an electrophoretic display panel may be used as the display panel 80. In the illustrated embodiment, an organic light emitting display panel is used as the display panel 80.

The display panel 80 may include a display portion DAR and a driving portion DDR.

The display portion DAR includes pixels. Each pixel may include a light emitting layer and a circuit layer for controlling the amount of light emitted from the light emitting layer. The circuit layer may include a display wiring, a display electrode and at least one transistor. The light emitting layer may include an organic light emitting material. The light emitting layer may be encapsulated by an encapsulation layer. The encapsulation layer may encapsulate the light emitting layer to prevent moisture and the like from infiltrating from the outside. The encapsulation layer may be a single or multilayer film of an inorganic film, or a laminated film in which an inorganic film and an organic film are alternately laminated.

The display portion DAR may further include an optical film 60 disposed on the encapsulation layer. The optical film 60 may be disposed on the display portion DAR. The optical film 60 may include laminated films. The optical film 60 may include a first optical protective film disposed on the encapsulation layer, a phase retardation film disposed on the first optical protective film and a polarizing film disposed on the phase retardation film, and a second optical protective film disposed on the polarizing film.

The optical protective films of the optical film 60 may protect the polarizing film of the optical film 60 and the phase retardation film from external moisture and foreign substances. The optical protective films may include an organic insulating material.

The phase retardation film may change the phase of light. For example, the phase retardation film may be a $\lambda/4$ phase retardation film.

The polarizing film may selectively transmit light. For example, the polarizing film may be a linear polarizing film, such as a polyvinyl alcohol (PVA) film.

The display portion DAR may have a rectangular shape or a rectangular shape with rounded corners. However, the disclosure is not limited thereto, and the display portion DAR may have various shapes such as a square, other polygons, a circle, an ellipse or the like.

The driving portion DDR is disposed in the periphery of the display portion DAR, for example, on one side of the display portion DAR. The driving portion DDR may be a non-display portion that does not include a display surface. Unlike the display portion DAR, the driving portion DDR may include no pixels. When the display portion DAR has a rectangular shape with rounded corners, the driving portion DDR is disposed adjacent to at least one side of the rectangular shape of the display portion DAR. In FIG. 1, for example, the driving portion DDR is disposed adjacent to one short side of the display portion DAR. The driving portion DDR may include a driving wiring connected to the display wiring of the pixel and a pad of the driving wiring. An external component, such as a driving chip or a printed circuit board, may be mounted on the driving wiring pad, as will be described later.

In one embodiment, the display panel 80 may include a substrate 81. The substrate 81 may be a flexible substrate formed to include, for example, a flexible plastic material such as polyimide. The light emitting layer and the circuit layer of the display portion DAR may be disposed on one surface of the substrate 81. When the substrate 81 is flexible, the substrate 81 may be bent at the driving portion DDR. For example, the substrate 81 of the driving portion DDR disposed adjacent to the short side of the display portion DAR may be bent in a direction opposite to the display panel 80, and may extend to the back surface of the display portion DAR. The bent driving portion DDR may partially overlap the display portion DAR. One surface of the substrate 81 may be bent in the overlapping area, such that one surface of the substrate 81 of the display portion DAR may be oriented in opposite directions. That is, one surface of the substrate 81 of the display portion DAR may face upward, while one surface of the substrate 81 bent in the overlap region may face downward.

The driving wiring of the driving portion DDR may extend along the bending portion BA, and the driving wiring pad may be disposed on the overlapping area of the display portion DAR and the bent driving portion DDR.

The driving portion DDR of the display panel 80 may include a bending protective film 70. The bending protective film 70 may be disposed on one side of the optical film 60. Although it is illustrated in FIG. 7 that the optical film 60 and the bending protective film 70 are disposed on the same layer, and the optical film 60 is disposed on the encapsulation layer of the display portion DAR as described above, the bending protective film 70 may not overlap the encapsulation layer, such that the optical film 60 and the bending protective film 70 may not be disposed on the same layer, and the optical film 60 may be located above the bending protective film 70 in an amount corresponding to a thickness of the encapsulation layer.

The bending protective film 70 covers and protects the driving wiring. Furthermore, the bending protective film 70 may serve to enhance the rigidity of the flexible substrate 81 or to alleviate stress in the bending portion BA. The bending protective film 70 exposes a portion including the driving wiring pad.

In one embodiment, the bending protective film 70 may include an organic coating layer such as polyimide, acrylate, epoxy and the like. In another embodiment, the bending protective film 70 may be attached in the form of a protective film.

The driving wiring pad of the driving portion DDR of the display panel 80 may be electrically connected to a display printed circuit board COF. For example, the driving wiring pad may be disposed on one surface of the substrate 81, and the display printed circuit board COF may be attached onto the driving wiring pad through an anisotropic conductive film (ACF) or the like. The display printed circuit board COF may be a film type flexible printed circuit board. A driving chip D_IC may be mounted on the display printed circuit board COF. The display printed circuit board COF may be formed of a chip on film, a tape carrier package, or the like.

The display printed circuit board COF may be electrically connected to a main circuit board MB. The main circuit board MB may be formed of a rigid printed circuit board. The main circuit board MB and the display printed circuit board COF may be attached to each other via an anisotropic conductive film (ACF) or the like.

The display portion DAR of the display panel 80 may be a first flat portion FA1 formed of a flat surface. The driving portion DDR of the display panel 80 may include a second flat portion FA2 which overlaps the first flat portion FA1 in the thickness direction, and a bending portion BA which is bent in a direction opposite to the display surface and located between the first flat portion FA1 and the second flat portion FA2. Hereinafter, the first flat portion FA1, the second flat portion FA2 and the bending portion BA of the display panel 80 will be described.

The touch panel 30 is disposed above the display panel 80. The touch panel 30 includes a lower surface 30b facing the display panel 80 and an upper surface 30a opposite to the lower surface 30b. The touch panel 30 may acquire position information of an input point by a capacitive method, a resistive method, an electromagnetic induction method, an infrared method, or the like. In this embodiment, a capacitive touch panel 30 is exemplified, but the disclosure is not limited thereto.

The touch panel 30 may be disposed on the first flat portion FA1 of the display panel 80, may overlap the first flat portion FA1 and the second flat portion FA2, and may partially overlap the bending portion BA. However, the disclosure is not limited thereto, such that the touch panel 30 may not overlap the bending portion BA of the display panel 80.

The touch panel 30 includes a sensing portion TAR and a pad side portion TDR. When the touch panel 30 has a rectangular shape in plan view, the touch panel 30 may include four side portions adjacent to the respective sides. The pad side portion TDR may be located at one side portion adjacent to one short side of the touch panel 30 in plan view. The pad side portion TDR may be disposed on one side with respect to the sensing portion TAR. For example, the pad side portion TDR may be located on one side of the sensing portion TAR in a first direction DR1.

The planar shape of the touch panel 30 may substantially correspond to the planar shape of the first flat portion FA1 of the display panel 80. When the first flat portion FA1 of the display panel 80 has a rectangular shape with rounded corners, the planar shape of the touch panel 30 also has a substantially rectangular shape with rounded corners. The side surface of the pad side portion TDR of the side surface of the touch panel 30 may have a linear shape in plan view.

The upper surface 30a of the pad side portion TDR of the touch panel 30 may include a first connection area CNA1 and a second connection area CNA2 to which a first attachment portion CB1 and a second attachment portion CB2 of a touch printed circuit board 40 are attached, and a first non-connection area NCA1 to which the first and second attachment portions CB1 and CB2 of the touch printed circuit board 40 are not attached.

First touch signal pads T_PAD1 and second touch signal pads T_PAD2 are disposed in the first connection area CNA1 and the second connection area CNA2, respectively.

In the first non-connection area NCA1, the first touch signal pad T_PAD1 and the second touch signal pad T_PAD2 are not disposed, and a dummy pad may be disposed, such that the touch printed circuit board 40 is not directly attached thereto.

Further, the lower surface 30b of the pad side portion TDR of the touch panel 30 may include a third connection area CNA3 to which a third attachment portion CB3 of the touch printed circuit board 40 is attached, and a second non-connection area NCA2 to which the third attachment portion CB3 of the touch printed circuit board 40 is not attached.

Third touch signal pads T_PAD3 are disposed in the third connection area CNA3. In the second non-connection area NCA2, the third touch signal pad T_PAD3 is not disposed, and a dummy pad may be disposed, such that the touch printed circuit board 40 is not directly attached thereto.

The first connection area CNA1 and the second connection area CNA2 may be separated from each other with the third connection area CNA3 interposed therebetween in plan view. The first non-connection area NCA1 may be disposed to overlap the third connection area CNA3 in the thickness direction, and the second non-connection area NCA2 may be disposed to overlap the first connection area CNA1 and the second connection area CNA2 in the thickness direction.

In some embodiments, the side surface of the pad side portion TDR of the touch panel 30 may not have a linear shape in plan view. For example, the plan profile of the side surface of the pad side portion TDR of the touch panel 30 may include a reference line and a protrusion portion which protrudes outward from the reference line. The protrusion portion of the pad side portion TDR may be disposed to correspond to the first to third connection areas CNA1 to CNA3. That is, the pad side portion TDR of the touch panel 30 may have the protrusion portion in the third connection area CNA3. Further, the pad side portion TDR of the touch panel 30 may have respective protrusion portions in the first and second connection areas CNA1 and CNA2.

The touch panel 30 may include a touch electrode and/or a touch wiring.

The touch panel 30 may include a first touch protective film 310, a first wiring layer 320 disposed on the first touch protective film 310, a first touch insulating film 330 disposed on the first wiring layer 320, a second touch insulating film 350 disposed on the first touch insulating film 330, a second wiring layer 360 disposed on the second touch insulating film 350, and a second touch protective film 370 disposed on the second wiring layer 360. The touch panel 30 may further include a touch bonding film 340 which is disposed between the first touch insulating film 330 and the second touch insulating film 350, and which couples the first touch insulating film 330 to the second touch insulating film 350. The first wiring layer 320 and the second wiring layer 360 include electrodes 321, 323, 325, 361, 363, 365, T_PAD1, T_PAD2 and T_PAD3.

The first touch protective film 310 may cover and protect the first wiring layer 320. The first touch protective film 310 may be a shoulder resist layer. The shoulder resist layer may be formed to include an organic material such as polyethylene terephthalate (PET), polyimide (PI), polycarbonate (PC), polyethylene (PE), polypropylene (PP), polysulfone (PSF), polymethylmethacrylate (PMMA), triacetylcellulose (TAC), cycloolefin polymer (COP) and the like.

The first wiring layer 320 is disposed on one surface of the first touch protective film 310. The first wiring layer 320 may include first touch electrodes 321, a first connection electrode 323 connecting the adjacent first touch electrodes 321, a first touch signal wiring 325, and a third touch signal pad T_PAD3.

The first touch electrodes 321, the first connection electrode 323 connecting the adjacent first touch electrodes 321 and the first touch signal wiring 325 may be disposed at the sensing portion TAR of the touch panel 30, and the third touch signal pad T_PAD3 may be disposed at the driving portion DDR of the touch panel 30. The first touch signal wiring 325 may function to electrically connect the first touch electrode 321 to the third touch signal pad T_PAD3.

The first touch electrodes 321 adjacent to each other along a length direction of the touch panel 30 are physically connected through the first connection electrode 323. The width of the first connection electrode 323 may be smaller than the width of the first touch electrodes 321.

The first touch signal wiring 325 is connected to the first touch electrode 321 to extend toward the pad side portion TDR, and forms the third touch signal pad T_PAD3 at the pad side portion TDR. The first touch protective film 310 exposes one surface of the first touch signal wiring 325 at the driving portion DDR of the touch panel 30, and the exposed surface of the first touch signal wiring 325 may be the third touch signal pad T_PAD3. The touch printed circuit board 40 may be electrically connected to the exposed third touch signal pad T_PAD3.

The touch printed circuit board 40 may be a flexible printed circuit board. The touch printed circuit board 40 may include the first to third attachment portions CB1 to CB3. The first attachment portion CB1 located at one end of the touch printed circuit board 40 may be attached to the first touch signal pad T_PAD1 of the touch panel 30 through an anisotropic conductive film ACF or the like. The touch printed circuit board 40 may include a base film (not shown) and a touch lead wirings (not shown) disposed on the base film. One touch lead wiring may be coupled to the third touch signal pad T_PAD3. Another touch lead wiring may be coupled to the first touch signal pad T_PAD1, and another lead wiring may be coupled to the second touch signal pad T_PAD2.

The touch printed circuit board 40 may be bent so as to externally surround the bending portion BA of the display panel 80 from the outside as shown in FIGS. 7 and 8. The touch printed circuit board 40 may be electrically connected to the main circuit board MB and, accordingly, electrically connected to the display printed circuit board COF.

The third touch signal pad T_PAD3 may be located at a central portion of the pad side portion TDR in plan view. The first touch signal pad T_PAD1 and the second touch signal pad T_PAD2, to be described later, may be disposed with the third touch signal pad T_PAD3 interposed therebetween. The third touch signal pad T_PAD3 may have a slightly more extended shape than the first touch signal wiring 325 for connection with the touch printed circuit board 40, but the disclosure is not limited thereto.

The first touch insulating film 330 is disposed on the first wiring layer 320, and may be disposed over the entire surface of the first wiring layer 320.

The touch bonding film 340 may be disposed on the first touch insulating film 330. The touch bonding film 340 may be formed to include a material which serves to bond the first touch insulating film 330 and the second touch insulating film 350 together, and may be in the form of a conventional adhesive material.

The second touch insulating film 350 may be disposed on the touch bonding film 340. Each of the first touch insulating film 330 and the second touch insulating film 350 may have a single layer structure or a multilayer structure. Further, each of the first touch insulating film 330 and the second touch insulating film 350 may include an inorganic material, an organic material, or a composite material. In one embodiment, at least one of the first touch insulating film 330 and the second touch insulating film 350 may include an inorganic film. The inorganic film may include at least one of aluminum oxide, titanium oxide, silicon oxide, silicon oxynitride, zirconium oxide, and hafnium oxide.

At least one of the first touch insulating film 330 and the second touch insulating film 350 may include an organic film. The organic film may include at least one of acrylic resin, methacrylic resin, polyisoprene, vinyl resin, epoxy resin, urethane resin, cellulose resin, siloxane resin, polyimide resin, polyamide resin and perylene resin.

The second wiring layer 360 may be disposed on the second touch insulating film 350. The second wiring layer 360 may include second touch electrodes 361, a second connection electrode 363 connecting the adjacent second touch electrodes 361, a second touch signal wiring 365, a first touch signal pad T_PAD1, and a second touch signal pad T_PAD2. The first touch electrodes 321 and the second touch electrodes 361 may acquire position information of a point touched by a self-capacitance method and/or a mutual capacitance method.

The second touch electrodes 361, the second connection electrode 363 connecting the adjacent second touch electrodes 361 and the second touch signal wiring 365 may be disposed at the sensing portion TAR of the touch panel 30, and the first touch signal pad T_PAD1 and the second touch signal pad T_PAD2 may be disposed at the pad side portion TDR of the touch panel 30. The second touch signal wiring 365 may function to electrically connect the second touch electrode 361 to the first touch signal pad T_PAD1 and the second touch electrode 361 to the second touch signal pad T_PAD2. The first touch signal pad T_PAD1 may be disposed on one side of the pad side portion TDR of the third touch signal pad T_PAD3 in a direction intersecting a direction toward the sensing portion TAR in plan view. The second touch signal pad T_PAD2 may be disposed on the other side of the pad side portion TDR of the third touch signal pad T_PAD3 in a direction intersecting a direction toward the sensing portion TAR in plan view. For example, the first touch signal pad T_PAD1 may be disposed on one side of the third touch signal pad T_PAD3 in a second direction DR2 in plan view, and the second touch signal pad T_PAD2 may be disposed on the other side of the third touch signal pad T_PAD3 in the second direction DR2 in plan view.

The second touch electrodes 361 adjacent to each other along the length direction of the touch panel 30 are physically connected through the second connection electrode 363. The width of the second connection electrode 363 may be less than the width of the second touch electrodes 361.

The second touch signal wiring 365 is connected to the second touch electrode 361 and extends toward the pad side portion TDR, and forms the first touch signal pad T_PAD1 and the second touch signal pad T_PAD2 at the pad side portion TDR. The second touch protective film 370 exposes one surface of the second touch signal wiring 365 at the pad side portion TDR of the touch panel 30, and the exposed surface of the second touch signal wiring 365 may be the first touch signal pad T_PAD1 or the second touch signal pad T_PAD2. The first and second touch signal pads T_PAD1 and T_PAD2 may be arranged along the second direction DR2, respectively.

The touch printed circuit board 40 may be electrically connected to the exposed first and second touch signal pads T_PAD1 and T_PAD2. The first attachment portion CB1 of the touch printed circuit board 40 may be attached to the first touch signal pad T_PAD1 via an anisotropic conductive film ACF or the like, and the second attachment portion CB2 may be attached to the second touch signal pad T_PAD2 via an anisotropic conductive film (ACF) or the like.

The first and second touch signal pads T_PAD1 and T_PAD2 may have a slightly more extended or other shape than the second touch signal wiring 365 for connection with the touch printed circuit board 40.

The first touch electrodes 321 and the second touch electrodes 361 may be arranged in a matrix form in plan view. The first touch electrodes 321 and the second touch electrodes 361 may have a rhombic or other shape.

The first touch electrodes 321 may be electrically connected along a column direction (e.g., the length direction mentioned above), and the second touch electrodes 361 may be electrically connected along a row direction (e.g., a short side, or width, direction opposite the length direction). However, the disclosure is not limited thereto, and the first touch electrodes 321 may be electrically connected along the row direction and the second touch electrodes 361 may be electrically connected along the column direction. The first touch electrodes 321 and the second touch electrodes 322 are insulated and separated from each other through the touch insulating films 330 and 350 disposed between the first touch electrodes 321 and the second touch electrodes 361.

Each of the first wiring layer 320 and the second wiring layer 360 may be formed of a conductive material. For example, the first wiring layer 320 and the second wiring layer 360 may be formed to include a transparent conductive oxide, such as indium tin oxide (ITO), indium zinc oxide (IZO), zinc oxide (ZnO), indium tin zinc oxide (ITZO), a metal material such as molybdenum, silver, titanium, copper, aluminum, or an alloy thereof, a conductive polymer such as PEDOT, metal nanowires, carbon nanotubes, graphene, and/or the like.

When the first wiring layer 320 and the second wiring layer 360 include an opaque material, the first touch electrodes 321 and the second touch electrodes 361 may be formed in a mesh shape.

Referring to FIGS. 7 and 8, bending stress relieving layers CRD1 and CRD2 partially covering each of the touch panel 30 and the touch printed circuit board 40 that is attached to the touch panel 30 may be further disposed. Each of the bending stress relieving layers CRD1 and CRD2 may expose a partial region of a plurality of wirings of the touch printed circuit board 40 and cover another partial region, thereby preventing a short circuit of wirings of the touch printed circuit board 40 and/or corrosion caused by foreign substances. The bending stress relieving layers CRD1 and CRD2 may include an organic resin. For example, the bending stress relieving layers CRD1 and CRD2 may include an optically clear organic resin, and the optically clear organic resin may be an ultraviolet curable adhesive material, but is not limited thereto.

The first bending stress relieving layer CRD1 may cover and contact the side surface of the touch panel 30 and the lower surfaces of the first and second attachment portions CB1 and CB2 exposed by the touch panel 30 of the touch printed circuit board 40.

The second bending stress relieving layer CRD2 may cover and contact the side surface of the touch panel 30 and the upper surface of the third attachment portion CB3 exposed by the touch panel 30 of the touch printed circuit board 40.

The window 10 is disposed above the touch panel 30. The window 10 covers and protects the touch panel 30 and/or the display panel 80. The window 10 completely overlaps the touch panel 30. The window 10 may be larger than the touch panel 30, and its side surface may protrude from each side surface of the touch panel 30. Further, the window 10 may completely overlap the bending portion BA as well as the first and second flat portions FA1 and FA2 of the display panel 80. The window 10 may be larger than the display panel 80, and its side surface may protrude from each side of the display panel 80.

The window 10 may be made of a transparent material. The window 10 may include, for example, glass or plastic. When the window 10 includes plastic, the window 10 may be flexible.

Examples of plastics applicable to the window 10 may include, but are not limited to, polyimide, polyacrylate, polymethylmethacrylate (PMMA), polycarbonate, (PC), polyethylene naphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, triacetyl cellulose (TAC), and cellulose acetate propionate (CAP). The plastic window 10 may be formed to include one or more of the plastic materials listed above.

When the window 10 includes plastic, it may further include a coating layer (not shown) disposed on the upper and lower surfaces of the plastic. In one embodiment, the coating layer may be a hard coating layer including an organic layer and/or an organic-inorganic hybrid layer including an acrylate compound and the like. The organic layer may include an acrylate compound. The organic-inorganic hybrid layer may be a layer in which an inorganic material such as silicon oxide, zirconium oxide, aluminum oxide, tantalum oxide, niobium oxide and glass beads is dispersed in an organic material such as an acrylate compound. In another embodiment, the coating layer may include a metal oxide layer. The metal oxide layer may include, but is not limited to, a metal oxide such as titanium, aluminum, molybdenum, tantalum, copper, indium, tin and tungsten.

The first optically clear adhesive member 20 is disposed between the window 10 and the touch panel 30. The window 10 and the touch panel 30 may be coupled to each other by the first optically clear adhesive member 20. The second optically clear adhesive member 50 is disposed between the touch panel 30 and the display panel 80. The touch panel 30 and the display panel 80 may be coupled to each other by the second optically clear adhesive member 50.

Each of the first optically clear adhesive member 20 and the second optically clear adhesive member 50 may be made of an optically clear adhesive film, an optically clear adhesive tape, an optically clear resin, or the like.

Although the first optically clear adhesive member 20 and the second optically clear adhesive member 50 may be made of the same material, their properties may be different. For example, the first optically clear adhesive member 20 may have a modulus of elasticity less than that of the second optically clear adhesive member 50.

The first optically clear adhesive member 20 may be thinner than the second optically clear adhesive member 50. For example, the thickness of the first optically clear adhesive member 20 may be 0.1 mm, and the thickness of the second optically clear adhesive member 50 may be 0.15 mm. However, a thickness relationship between the first optically clear adhesive member 20 and the second optically clear adhesive member 50 is not limited to the above example.

The display device 1 may further include a panel lower sheet 90 disposed below the display panel 80, as shown in FIG. 1. The panel lower sheet 90 may be disposed to overlap the first flat portion FA1 and the second flat portion FA2 of the display panel 80. The panel lower sheet 90 may not be disposed on the bending portion BA of the display panel 80.

The display device 1 may further include a lower bracket BRK attached to the window 10, and covering the lower surfaces and side surfaces of the display panel 80, the touch panel 30 and the panel lower sheet 90. That is, the components of the display device 1, excluding the window 10, may be mounted together by the lower bracket BRK.

Referring to FIGS. 7 and 8, the panel lower sheet 90 may include stacked components 91, 93, 95 and 97. The panel lower sheet 90 may include a first support film 91 disposed on the second flat portion FA2 of the display panel 80, a lower bonding layer 93 disposed on the first support film 91, a lower metal layer 95 disposed on the lower bonding layer 93, and a second support film 97 disposed on the lower metal layer 95.

The support films 91 and 97 may support the flat portions FA1 and FA2 of the display panel 100. The support films 91 and 97 may be formed to include at least one of polyethylene terephthalate (PET), polyimide (PI), polycarbonate (PC), polyethylene (PE), polypropylene (PP), polysulfone (PSF), polymethylmethacrylate (PMMA), triacetylcellulose (TAC) and cycloolefin polymer (COP).

The first support film 91 and the second support film 97 may be disposed on the flat portions FA1 and FA2 of the display panel 80 and may expose the bending portion BA. That is, the side surfaces of the support films 91 and 97 facing the bending portion BA may be generally located at the boundary between the flat portions FA1 and FA2 and the bending portion BA, respectively. Specifically, the display panel 80 includes one surface that is a display surface and a second surface that is opposite to the one surface. The first support film 91 may be disposed on the second flat portion FA2 of the display panel 80, and the second support film 97 may be disposed on the first flat portion FA1 of the display panel 80. Although not shown, the support films 91 and 97 may be adhered to the second surface of the display panel 80 through a bonding layer, respectively.

The lower bonding layer 93 may be disposed between the first support film 91 and the second support film 97. One side surface of the lower bonding layer 93 may be located inward from one side surface 91s of the first support film 91, without affecting alignment thereof with the first support film 91. For instance, and with reference to FIGS. 1, 7, and 9, the lower bonding layer 93 is located more inwardly from, i.e., away from, the bending portion BA at a short side surface of the display device 1 than is the first support film 91. When aligned, another side surface of the lower bonding layer 93 may be aligned with another side surface of the first support film 91, though the disclosure is not limited thereto.

The lower bonding layer 93 may include a bonding layer, an adhesive layer, a tackifying layer, or a resin layer. For example, the lower bonding layer 93 may contain a polymer material classified into a silicone polymer, a urethane polymer, an SU polymer having a silicone-urethane hybrid structure, an acrylic polymer, an isocyanate polymer, a polyvinyl alcohol polymer, a gelatin polymer, a vinyl polymer, a latex polymer, a polyester polymer, a water-based polyester polymer, and the like.

The lower metal layer 95 may be disposed between the lower bonding layer 93 and the second support film 97. The lower metal layer 95 may be disposed entirely over the flat portions FA1 and FA2 of the display panel 80. The lower metal layer 95 may be an electromagnetic shielding layer. For example, the lower metal layer 95 may include a thin metal film such as copper (Cu), aluminum (Al), gold (Au), or silver (Ag). In some embodiments, the panel lower sheet 90 may further include a heat dissipation layer stacked with the lower metal layer 95. The heat dissipation layer may include a material such as graphite or carbon nanotubes (CNT).

The second support film 97 may be disposed on the first flat portion FA1 of the display panel 80, and on the lower metal layer 95. Although not shown, the second support film 97 may be bonded to the lower metal layer 95 disposed therebelow through a bonding layer. The bonding layer between the second support film 97 and the lower metal layer 95 may include the same material as the above-mentioned material of the lower bonding layer 93. The second support film 97 may face the first support film 91.

A region of the display panel 80 overlapping respective side surfaces 91s and 97s of the support films 91 and 97 may experience larger than desired bending stress when an area of the display panel 80 overlapping the side surface 97s is subjected to an impact. Such an impact may cause cracks in and disconnection of the wirings disposed in the above-mentioned region of the display panel 80, including, at least, the wirings in the bending portion BA and also those connecting the touch pads to the printed circuit board 40.

As shown in FIG. 7, the portion of the display panel 80 overlapping the first attachment portion CB1 of the touch printed circuit board 40, e. g. display substrate 81, and the first bending stress relieving layer CRD1 covering the first attachment portion CB1 may be brought into direct contact due to an external impact, for example, when the display device 1 is dropped. As mentioned, such an external impact may exert a larger than desired bending stress on the overlapping portion due to the proximity of the one side surface 97s of the second support film 97 to the overlapping portion of the display substrate 81.

Therefore, in the display device 1 according to the embodiment, the side surface 97s of the second support film 97 which overlaps the first and second attachment portions CB1 and CB2 of the touch printed circuit board 40 in the thickness direction of the display device 1 may be located inwardly from, i.e., upward and away from, each a remaining portion of the side surface 97s which does not overlap the first and second attachment portions CB1 and CB2 in the thickness direction and the bending portion BA at a short side of the display device 1.

That is, when referring to FIGS. 5 and 7, the second support side surface 97s overlapping the first and second attachment portions CB1, CB2 of the touch printed circuit board 40 in the thickness direction may include an indent pattern IDP, which is shown, in FIG. 7 for example, in dotted lines to represent the absence of an extension of the second support film side surface 97s. The indent pattern IDP may be indented inwardly, i.e., upwardly, relative to a portion of the first support film 91 which does not overlap the first and second attachment portions CB1, CB2 of the touch printed circuit board 40 in the thickness direction. The planar shape of the indent pattern IDP may be a rectangular shape, but is not limited thereto, and may be a square shape or a rectangular shape with rounded corners.

The side surface 97s of the second support film 97 may be located more inwardly than the a side surface 91s of the first support film 91, and may be located more outward than the side surface of the optical film 60 disposed thereabove. That is, the second support film 97 may be disposed to overlap the first and second attachment portions CB1, CB2, to overlap and cover the optical film 60 from below, and to overlap and cover a portion of the bending protective film 70.

Specifically, as shown in FIG. 5, the first support film 91 may include a first edge EG1 extending in the second direction DR2 in plan view, and the second support film 97 may include a second edge EG2 extending in the second direction DR2 in plan view. The plan profile of an end portion of the first support film 91 may have a linear shape along the first edge EG1 as illustrated, whereas the plan profile of an end portion of the second support film 97 may include a portion extending along the second edge EG2, and an indented portion, including indent pattern IDP, which is indented upward, i.e., inward, in the first direction DR1. That is, the indent pattern IDP is indented so as to be disposed inwardly, or upwardly, with respect to each of the first edge EG1, the second edge EG2, and a short side surface of the display device that is adjacent the bending portion BA. As such, the indent pattern IDP extends beyond a boundary between the bending portion BA and the first flat portion FA1. That is, the terms "inwardly" and "upwardly" are interchangeable, in the use thereof pertains to the perspective being considered.

As has been discussed, the indent pattern IDP of the second support film 97 may be disposed to overlap the first and second attachment portions CB1 and CB2 of the touch printed circuit board 40 in the thickness direction. That is, the indent pattern IDP may be provided plurally. As shown in FIG. 5, indent patterns IDPs may be arranged in the second direction DR2 to correspond to the first and second attachment portions CB1 and CB2 of the touch printed circuit board 40.

Referring to FIG. 9, when an external impact occurs, for example, when the display device 1 is dropped, the lower bracket BRK first receives an external impact, and the lower bracket BRK is partially deformed (e.g., dented inward). Accordingly, the lower bracket BRK, the touch printed circuit board 40 and the display panel 80 may be in direct contact with each other.

For example, the portion 81 of the display panel 80 adjacent to the first and second attachment portions CB1 and CB2 and the first bending stress relieving layer CRD1 disposed thereon and the side surface 97s of the second support film 97 may be brought into direct contact with the first bending stress relieving layer CRD1 covering the first attachment portion CB1 due to this physical impact, and the bending stress due to the proximity of the side surface 97s may be larger than desired.

However, in the display device 1 according to an embodiment, by forming the indent patterns IDP which are indented inward in a region of the second support film 97 disposed to overlap the first and second attachment portions CB1 and CB2 of the touch printed circuit board 40, it is possible to prevent the bending stress of the display panel 80 from being increased since the side surface 97s of the second support film 97 has a decreased proximity with the above adjacent portion 81 at the location of the indent pattern IDPs. Accordingly, the above-discussed wiring disconnection may be prevented.

Hereinafter, a display device according to another embodiment will be described. In the following embodiment, the same components as those of the above-described embodiment are denoted by the same reference numerals, and a description thereof will be omitted or simplified.

Figure 10:
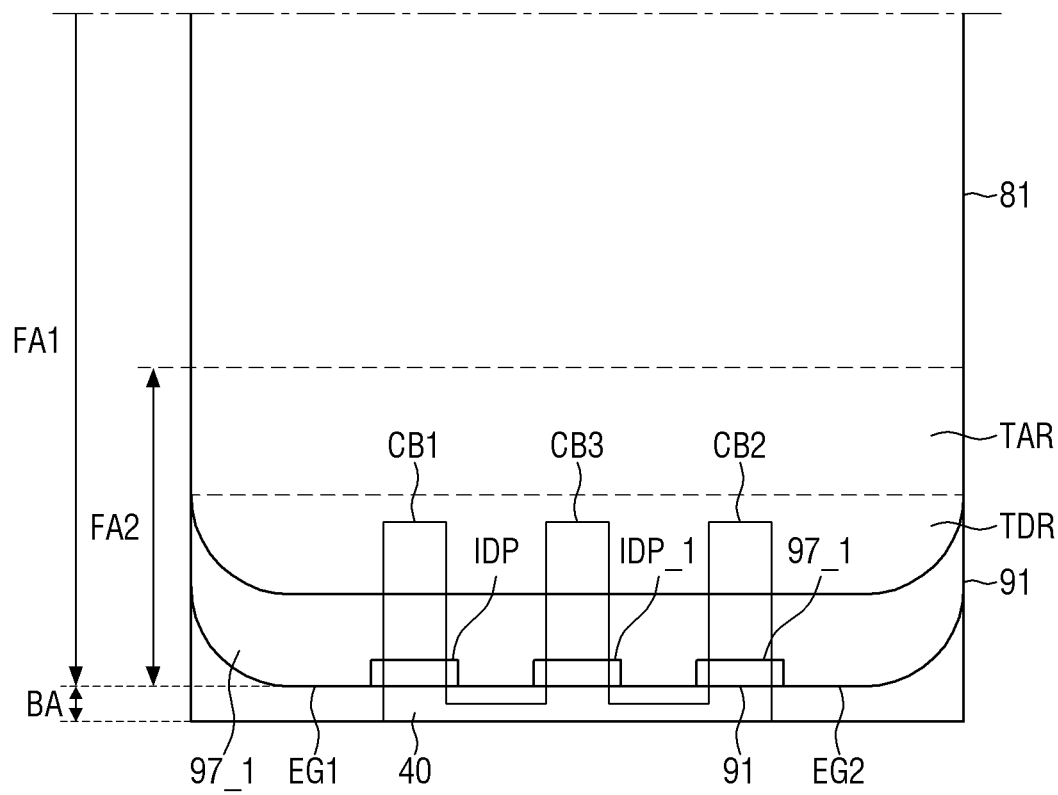
FIG. 10 is a plan layout diagram showing a planar arrangement relationship between first and second support films and a touch printed circuit board according to another embodiment.
Figure 10:
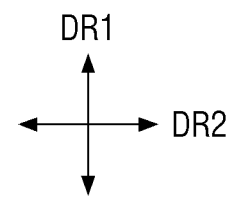
Figure 11:
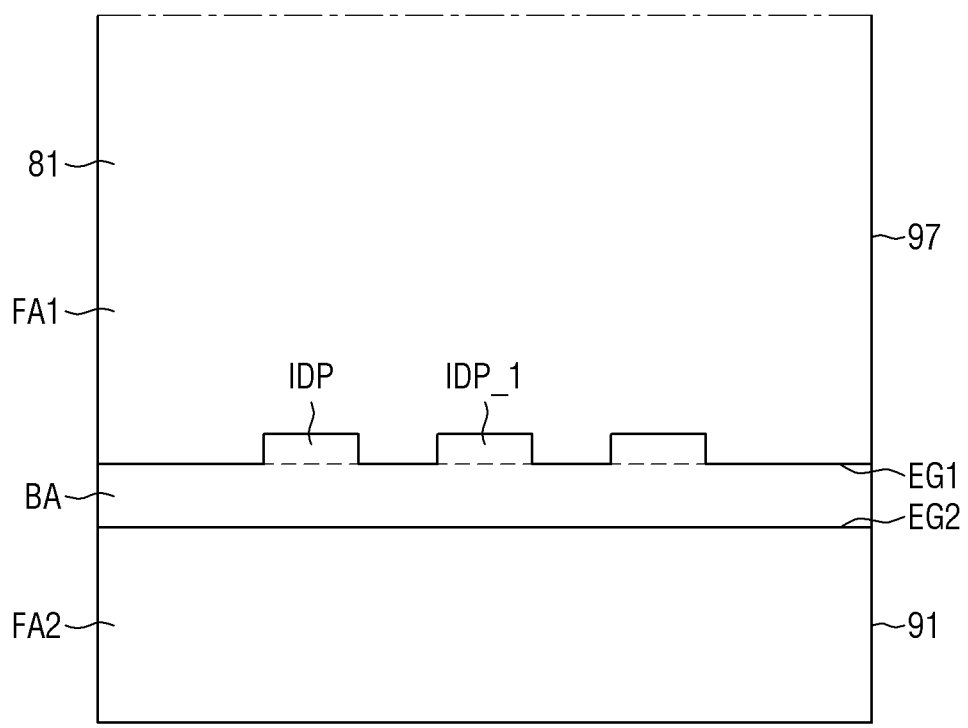
FIG. 11 is a plan layout diagram showing a planar arrangement relationship between first and second support films and a display panel in an unfolded state according to the embodiment of FIG. 10.
Figure 12:
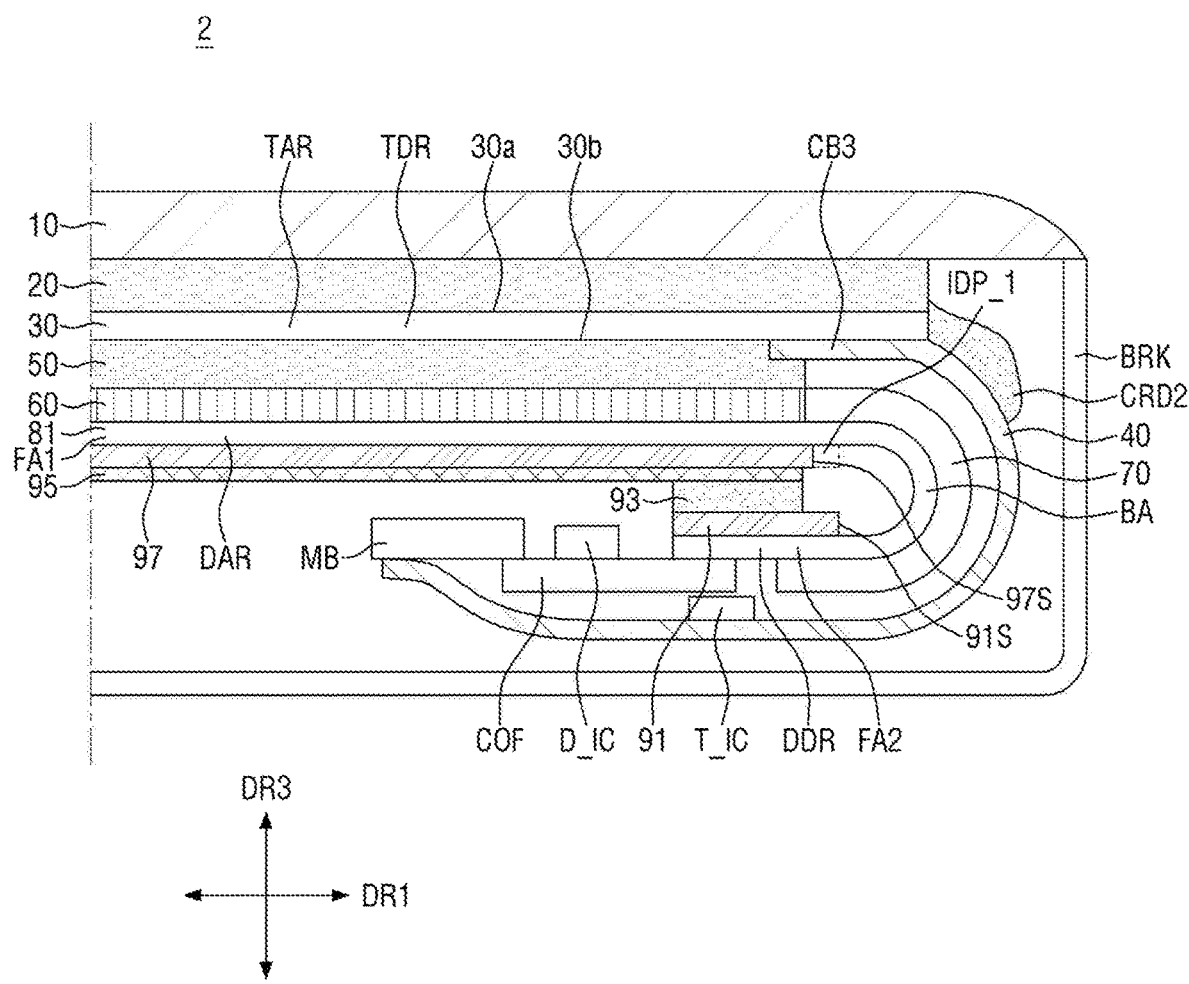
FIG. 12 is a cross-sectional view of a display device according to the embodiment of FIG. 10.

FIG. 10 is a plan layout diagram showing a planar arrangement relationship between first and second support films and a touch printed circuit board according to an embodiment. FIG. 11 is a plan layout diagram showing a planar arrangement relationship between first and second support films and a display panel in an unfolded state according to the embodiment of FIG. 10. FIG. 12 is a cross-sectional view of a display device according to the embodiment of FIG. 10.

Referring to FIGS. 10 to 12, a display device 2 according to the embodiment is different from the display device 1 according to the above-described embodiment in that a second support film 97_1 further includes an indent pattern IDP_1 disposed to overlap the third attachment portion CB3 of the touch printed circuit board 40 in the thickness direction of the display device 2.

More specifically, the display device 2 according to the embodiment may be configured such that the second support film 97_1 further includes the indent pattern IDP_1 disposed to overlap the third attachment portion CB3 of the touch printed circuit board 40 in the thickness direction.

That is, the plan profile of an end portion of the second support film 97_1 may include a portion extending along the second edge EG2 and an indented portion (indent patterns IDP and IDP_1) which are indented upward, i.e., inward, in the first direction DR1.

The indent pattern IDP_1 of the second support film 97_1 may be disposed to overlap the third attachment portion CB3 of the touch printed circuit board 40 in the thickness direction. The indent pattern IDP_1 of the second support film 97_1 may be disposed between the indent patterns IDP described in the above-described embodiment. The indentation shape and width of the indent pattern IDP_1 of the second support film 97_1 disposed to overlap the third attachment portion CB3 may be substantially the same as the indentation shape and width of the indent pattern IDP of the second support film 97_1 disposed to overlap the first and second attachment portions CB1 and CB2, but the disclosure is not limited thereto.

One side surface 97s of the second support film 97_1 that is disposed to overlap the third attachment portion CB3 in the thickness direction may be located more inward than one side surface 91s of the first support film 91, and may be located more outwardly than the side surface of the optical film 60 disposed thereabove. That is, the second support film 97_1 disposed to overlap the third attachment portion CB3 in the thickness direction may be disposed to overlap and cover the optical film 60 from below, and to overlap and cover a portion of the bending protective film 70 from below.

According to the embodiment, the second support film 97_1 further includes the indent pattern IDP_1 in a region overlapping the third attachment portion CB3 in the thickness direction. Accordingly, as shown in FIG. 12, the bending stress of the display panel 80 may be prevented from being increased since the side surface 97s of the second support film 97_1 has a decreased proximity with the adjacent portion 81 of the display panel 80 at the location of the indent pattern IDP_1, thereby preventing wiring disconnection of the type discussed above.

In other words, when an external impact occurs, for example, when the display device 2 is dropped, the lower bracket BRK first receives an external impact, and the lower bracket BRK is partially deformed (e.g., dented inward). Accordingly, the lower bracket BRK, the touch printed circuit board 40 and the display panel 80 may be in direct contact with each other.

When the display device 2 is dropped, for example, contact of the lower bracket BRK with the second bending stress relieving layer CRD2 that is disposed on the third attachment portion CB3, as well as with the first and second attachment portions CB1 and CB2, may cause a portion 81 of the display panel 80 adjacent to side surface 97s of the second support film 97_1 to be brought into direct contact with the third attachment portion CB3 due to this physical impact, and the bending stress attributable to side surface 97s of the second support film 97_1 may be larger than desired.

However, in the display device 2 according to the embodiment, by forming the indent pattern IDP_1 which is indented inward in a region of the second support film 97_1 that is disposed to overlap the third attachment portion CB3 of the touch printed circuit board 40, the bending stress of the display panel 80 may be prevented from being increased since the side surface 97s of the second support film 97_1 of the display panel 80 has a decreased proximity with the adjacent portion 81 of the display panel 80 at the location of the indent pattern IDP_1, thereby preventing wiring disconnection.

Figure 13:
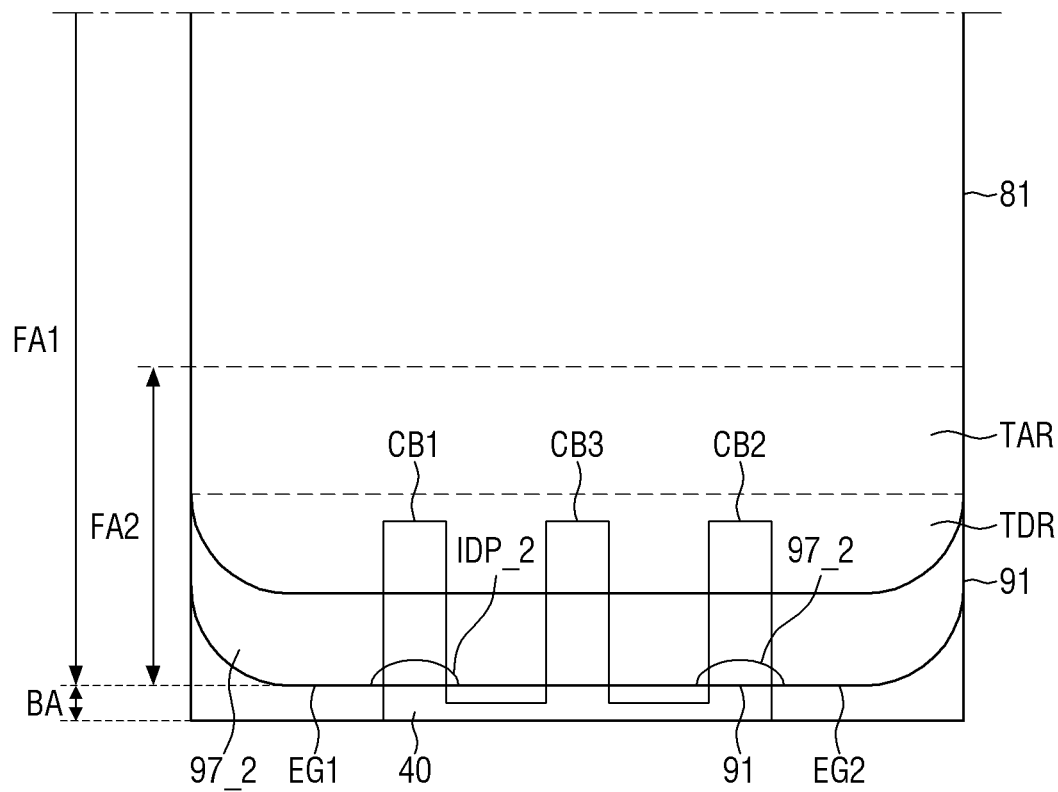
FIG. 13 is a plan layout diagram showing a planar arrangement relationship between first and second support films and a touch printed circuit board according to still another embodiment.
Figure 13:
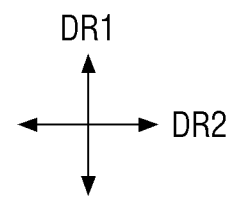
Figure 14:
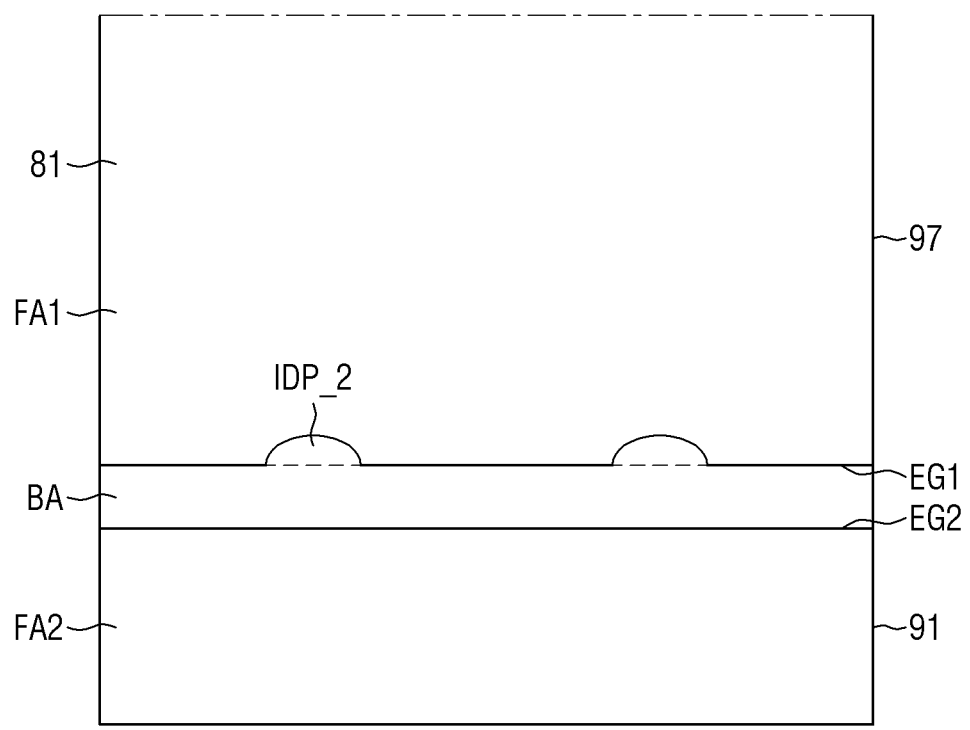
FIG. 14 is a plan layout diagram showing a planar arrangement relationship between first and second support films and a display panel in an unfolded state according to the embodiment of FIG. 13.

FIG. 13 is a plan layout diagram showing a planar arrangement relationship between first and second support films and a touch printed circuit board according to an embodiment. FIG. 14 is a plan layout diagram showing a planar arrangement relationship between first and second support films and a display panel in an unfolded state according to the embodiment of FIG. 13.

Referring to FIGS. 13 and 14, a display device 3 according to the present embodiment is different from the display device 1 according to the above-described embodiment in that a planar shape of an indent pattern IDP_2 includes a curved shape.

More specifically, the display device 3 according to the present embodiment may be configured such that the planar shape of the indent pattern IDP_2 includes a curved shape. The curved shape of the indent pattern IDP_2 of a second support film 97_2 may have a constant curvature, but is not limited thereto and may have a different curvature according to the region at which it is disposed.

When an external impact occurs, for example, when the display device 3 is dropped, the lower bracket BRK first receives an external impact, and the lower bracket BRK is partially deformed (e.g., dented inward). Accordingly, the lower bracket BRK, the touch printed circuit board 40 and the display panel 80 may be in direct contact with each other.

When this occurs, a portion of the display panel 80 adjacent to the first and second attachment portions CB1 and CB2 of the touch printed circuit board 40 and the first bending stress relieving layer CRD1 disposed thereon, and the side surface 97s of the second support film 97_2 may be brought into direct contact with the first bending stress relieving layer CRD1 covering the first attachment portion CB1, and the bending stress due to the proximity of the side surface 97s of the second support film 97_2 may be larger than desired.

However, in the display device 3 according to the embodiment, by forming the indent patterns IDP_2, which are indented inward in a region of the second support film 97_2 disposed to overlap the first and second attachment portions CB1 and CB2 of the touch printed circuit board 40, the bending stress of the display panel 80 may be prevented from being increased since the side surface 97s of the second support film 97_2 of the display panel 80 has a decreased proximity with the adjacent portion 81 of the display panel

80 at the location of the indent pattern IDP_2, thereby similarly preventing wiring disconnection.

Figure 15:
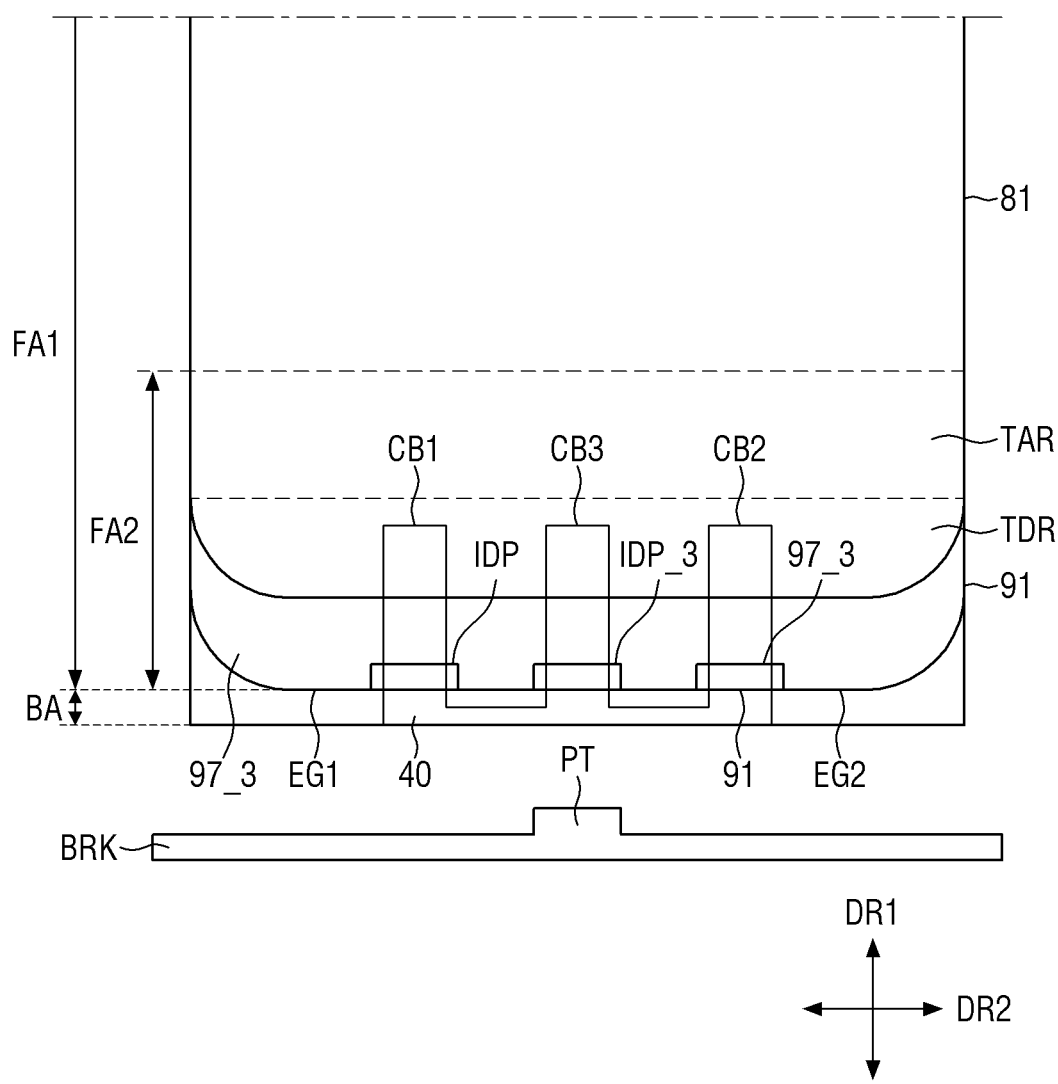
FIG. 15 is a plan layout diagram schematically showing a planar arrangement relationship between first and second support films, a touch printed circuit board and a lower bracket according to still another embodiment.
Figure 16:
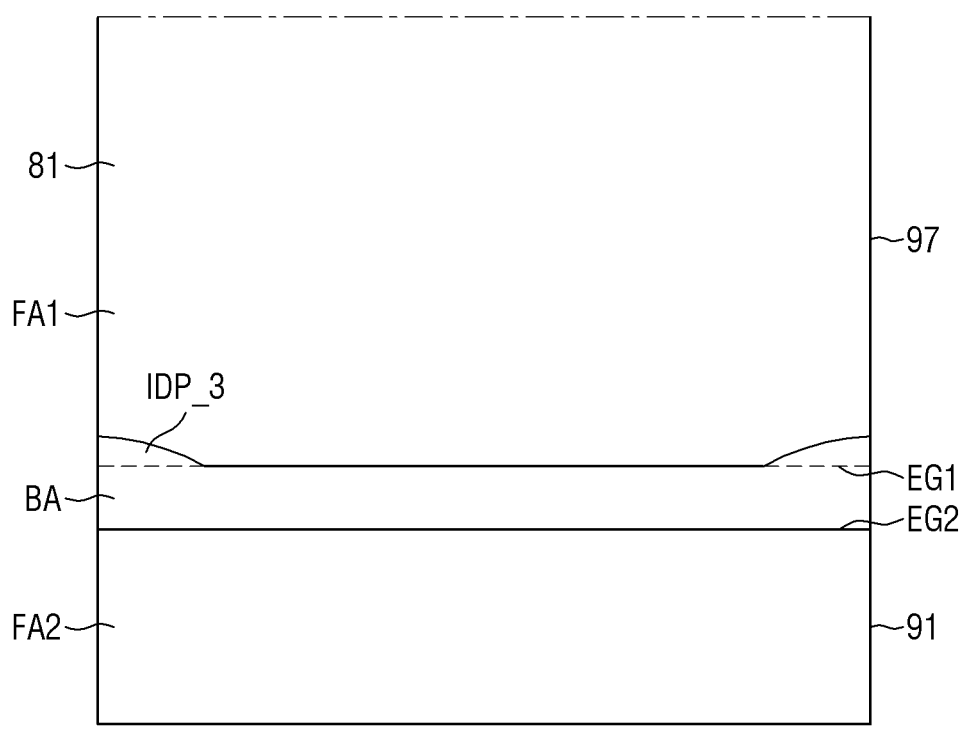
FIG. 16 is a plan layout diagram showing a planar arrangement relationship between first and second support films and a display panel in an unfolded state according to the embodiment of FIG. 15.

FIG. 15 is a plan layout diagram schematically showing a planar arrangement relationship between first and second support films, a touch printed circuit board and a lower bracket according to an embodiment. FIG. 16 is a plan layout diagram showing a planar arrangement relationship between first and second support films and a display panel in an unfolded state according to the embodiment of FIG. 15.

Referring to FIGS. 15 and 16, a display device 4 according to the embodiment is different from the display device 1 according to the above-described embodiment in that the lower bracket BRK further includes a protrusion pattern PT protruding toward the touch printed circuit board 40 and the display panel 80, and a second support film 97_3 further includes an indent pattern IDP_3 corresponding to the protrusion pattern PT of the lower bracket BRK.

Although FIG. 15 illustrates that the protrusion pattern PT of the lower bracket BRK is located between the first attachment portion CB1 and the second attachment portion CB2 in plan view, the disclosure is not limited thereto, and the protrusion pattern PT of the lower bracket BRK may be located on one side (i.e., the left side) of the first attachment portion CB1 in the second direction, or may be located on the other side (i.e., the right side) of the second attachment portion CB2 in the second direction. The protrusion pattern PT and the IDP_3 may correspond to each have same shapes and sizes.

When an external impact occurs, for example, when the display device 4 is dropped, the lower bracket BRK first receives an external impact, and the lower bracket BRK is partially deformed (e.g., dented inward). Accordingly, the lower bracket BRK, the touch printed circuit board 40 and the display panel 80 may be in direct contact with each other. In particular, the touch printed circuit board 40, which overlaps the protrusion pattern PT of the lower bracket BRK, may apply a larger bending stress to the display panel 80 than is desired.

That is, a portion of the display panel 80 located in a region corresponding to the protrusion pattern PT of the lower bracket BRK may further receive a bending stress resulting from the side surface 97s of the second support film 97_3.

However, in the display device 4 according to the embodiment, by forming the indent patterns IDP_3 which are indented inward in a region of the second support film 97_3 that is located in a region corresponding to the protrusion pattern PT of the lower bracket BRK, the bending stress of the display panel 80 may be prevented from being increased since the side surface 97s of the second support film 97_3 of the display panel 80 has a decreased proximity with the adjacent portion 81 of the display panel 80 at the location of the indent pattern IDP_3, thereby preventing the wiring disconnection discussed herein.

Although FIGS. 15 and 16 illustrate that the second support film 97_3 includes the indent pattern IDP disposed to overlap the first and second attachment portions CB1 and CB2, the disclosure is not limited thereto. In some embodiments, it may include only the indent pattern IDP_3 disposed to overlap the protrusion pattern PT of the lower bracket BRK, and may not include the indent pattern IDP disposed to overlap the first and second attachment portions CB1 and CB2.

Figure 17:
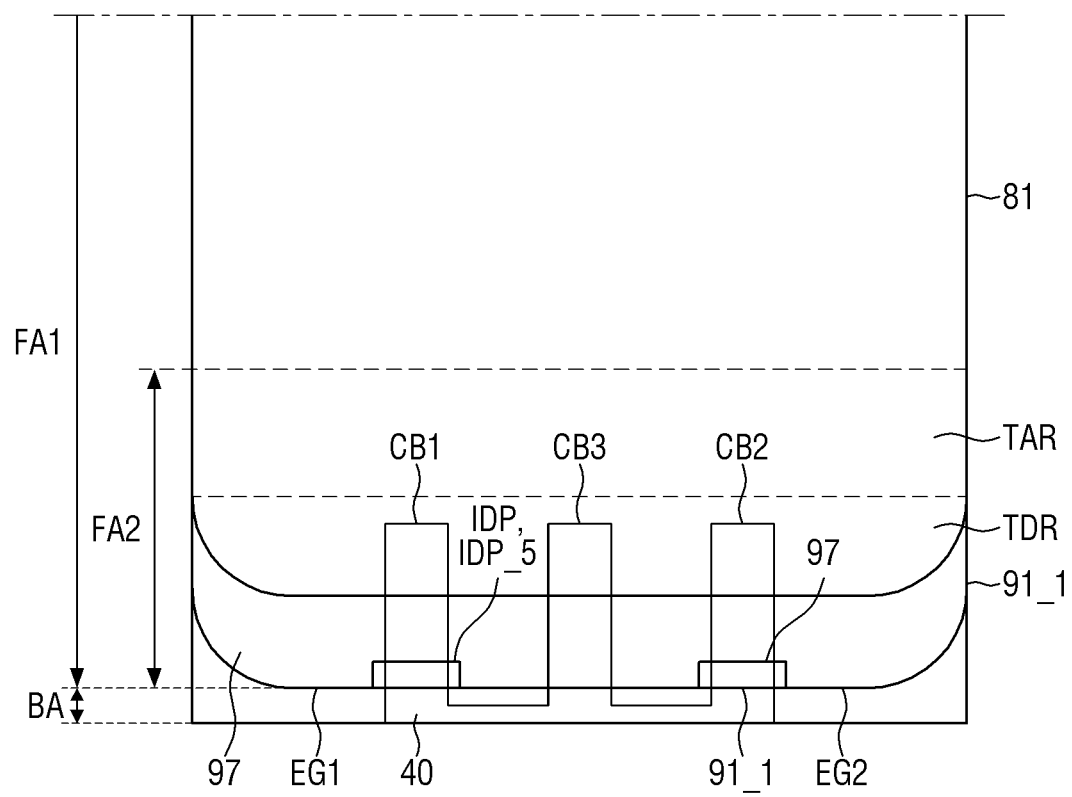
FIG. 17 is a plan layout diagram showing a planar arrangement relationship between first and second support films and a touch printed circuit board according to still another embodiment.
Figure 18:
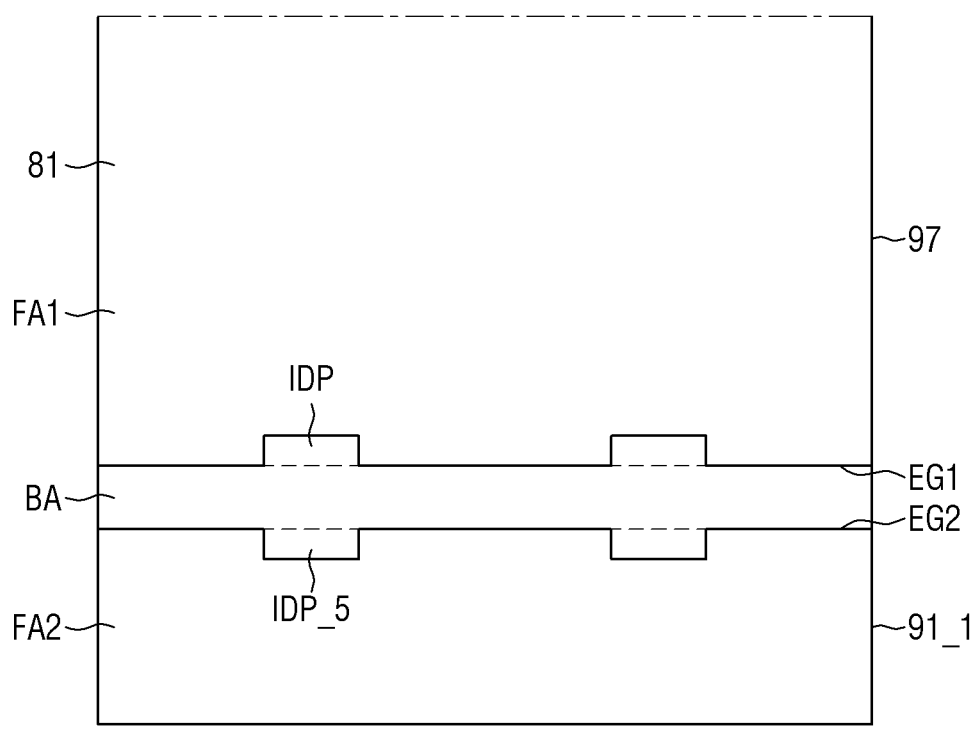
FIG. 18 is a plan layout diagram showing a planar arrangement relationship between first and second support films and a display panel in an unfolded state according to the embodiment of FIG. 17.
Figure 19:
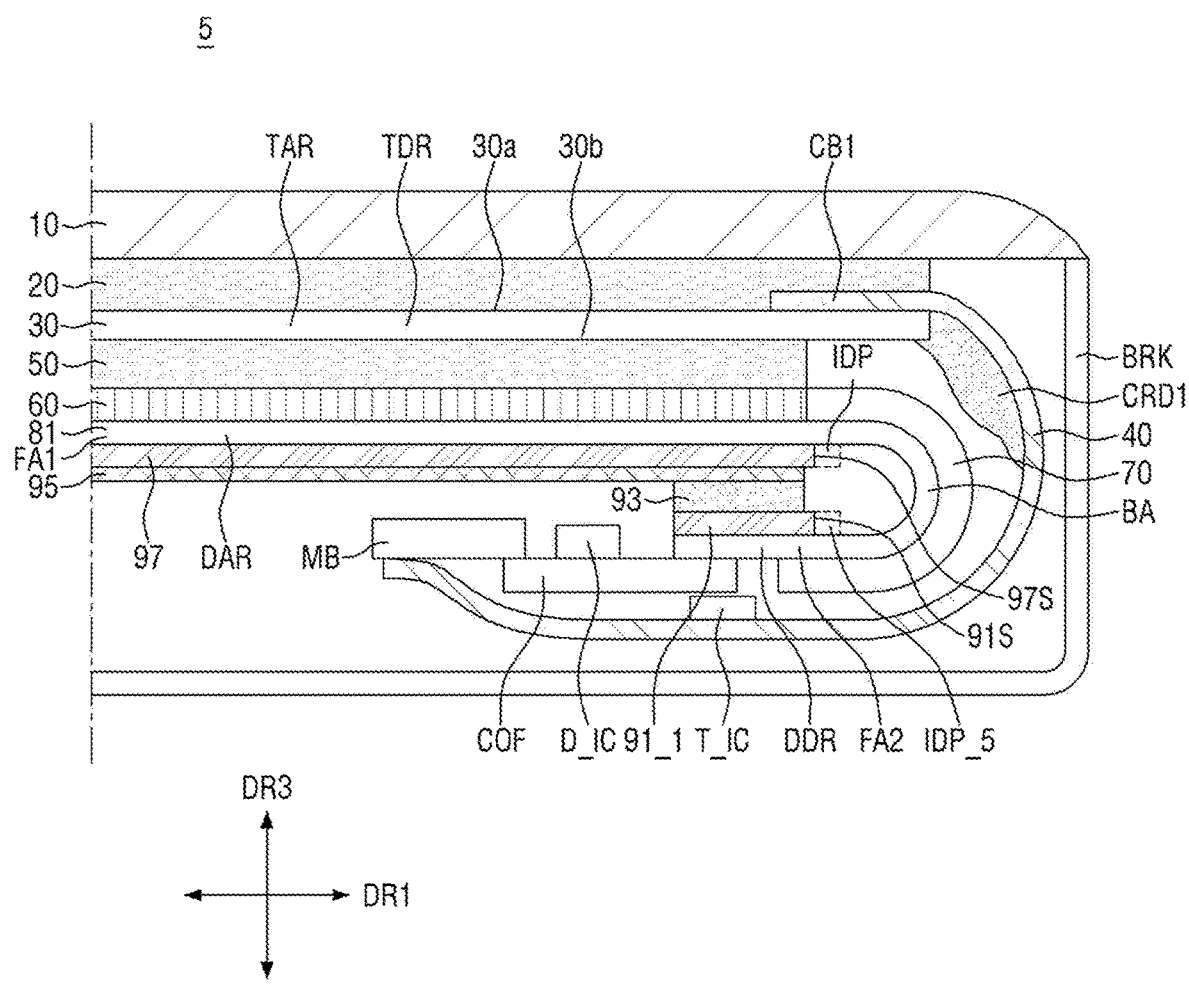
FIG. 19 is a cross-sectional view of a display device according to the embodiment of FIG. 17.

FIG. 17 is a plan layout diagram showing a planar arrangement relationship between first and second support films and a touch printed circuit board according to an embodiment. FIG. 18 is a plan layout diagram showing a planar arrangement relationship between first and second support films and a display panel in an unfolded state according to the embodiment of FIG. 17. FIG. 19 is a cross-sectional view of a display device according to the embodiment of FIG. 17.

Referring to FIGS. 17 to 19, a display device 5 according to the embodiment is different from the display device 1 according to the above-described embodiment in that a first support film 91_1 includes an indent pattern IDP_5 which is indented inward.

That is, as shown in FIG. 19, a portion of the display panel 80 overlapping the first attachment portion CB1 of the touch printed circuit board 40 and the first bending stress relieving layer CRD1 covering the first attachment portion CB1 may be brought into direct contact with the first bending stress relieving layer CRD1 covering the first attachment portion CB1 due to an external impact, for example, when the display device 5 is dropped, and may have a bending stress applied by one side surface 97s of the second support film 97.

However, in the display device 5 according to the embodiment, the side surface of the first support film 91_1 which overlaps the first and second attachment portions CB1 and CB2 of the touch printed circuit board 40 in the thickness direction may be located inwardly from a remaining portion of the side surface of the first support film 91_1 which does not overlap the first and second attachment portions CB1 and CB2 in the thickness direction.

In other words, the first support film 91_1 overlapping the first attachment portion CB1 and the second attachment portion CB2 of the touch printed circuit board 40 in the thickness direction may include the indent pattern IDP_5 which is indented inward relative to the remaining portion of the first support film 91_1 that does not overlap the first attachment portion CB1 and the second attachment portion CB2. The planar shape of the indent pattern IDP_5 may be substantially the same as the planar shape of the indent pattern IDP of the second support film 97, but it is obvious that different shapes may be applied.

For example, a side surface 91s of the first support film 91_1 disposed to overlap the first attachment portion CB1 and the second attachment portion CB2 may be aligned with the side surface 97s of the second support film 97 in the thickness direction, and may be located more outward than the side surface of the optical film 60 disposed thereabove. That is, the first support film 91 may be disposed to overlap the first attachment portion CB1 and the second attachment portion CB2, to overlap and cover the optical film 60 from below, and to overlap and cover a portion of the bending protective film 70 from below.

As shown in FIG. 18, the plan profile of an end portion of the first support film 91_1 may include a portion extending along the first edge EG1 as illustrated and an indented portion (indent pattern IDP_5) which is indented downwardly in the first direction DR1, i.e., inward in FIG. 19.

In view of the above, a bending stress that may be occasioned by an impact to a display device bending portion may be prevented so as to prevent disconnection of wirings that may be contained within or adjacent to the bending portion. As has been discussed, at least one support film for the display device includes an indent pattern disposed to overlap an attachment portion of a touch printed circuit board, and the indent pattern is disposed inwardly of the bending portion and from a remaining portion of the at least one support film. As such, the indent pattern is disposed further away from a short side surface of the display device so that a display surface portion has a lesser proximity to the at least one support film, and vice versa, when compared to a proximity thereof in a case in which the indent pattern was not provided. Therefore, since opportunity for contact between the bending portion and the at least one support film is decreased, disconnection of the wirings within and adjacent the bending portion may likely be prevented.

While the disclosure has been illustrated and described with reference to the embodiments thereof, it will be apparent to those of ordinary skill in the art that various changes in form and detail may be formed thereto without departing from the spirit and scope of the disclosure.

What is claimed is:

1. A display device comprising:
a display panel including a flexible substrate having a display surface, the flexible substrate including a first flat portion, a second flat portion disposed to overlap the first flat portion in a thickness direction of the display device, and a bending portion between the first flat portion and the second flat portion;
a touch panel being disposed on the display panel, and including a pad side portion;
a touch printed circuit board including a first attachment portion attached to a first surface of the pad side portion; and
in the thickness direction, a first support film disposed to overlap the first flat portion, and a second support film disposed to overlap the second flat portion,
wherein the first support film includes a first indent pattern which is indented inwardly of the bending portion and from a remaining portion of the first support film, and
when the substrate is not bent, the first flat portion of the substrate is disposed between the first support film and the touch panel.

2. The display device of claim 1, wherein the touch printed circuit board is bent in a direction opposite to the display surface to cover the bending portion, and
the display device further comprises a first bending stress relieving layer covering a lower surface of the first attachment portion exposed by the touch panel.

3. The display device of claim 2, further comprising:
an optical film disposed between the touch panel and the flexible substrate; and
a bending protective film disposed on a side of the optical film to cover the bending portion,
wherein the first support film is disposed to overlap at least a portion of each of the bending protective film and the optical film.

4. The display device of claim 3, wherein the first support film and the second support film face each other, and
the display device further comprises a bonding layer disposed between the first support film and the second support film.

5. The display device of claim 4, further comprising a metal layer disposed between the bonding layer and the first support film.

6. The display device of claim 3, wherein the second support film includes a second indent pattern indented inwardly of the bending portion and from a remaining portion of the second support film.

7. The display device of claim 6, wherein a side surface of the first support film is aligned with a side surface of the second support film.

8. The display device of claim 3, wherein the touch printed circuit board includes first attachment portions, and the first support film includes first indent patterns respectively disposed to overlap the first attachment portions.

9. The display device of claim 3, wherein a width of the first attachment portion in a first direction is less than a width of the first indent pattern in the first direction, and the first direction intersects a direction in which the first flat portion is viewed from the bending portion.

10. The display device of claim 3, wherein a planar shape of the first indent pattern includes a curved shape.

11. The display device of claim 3, wherein a side surface of the first support film is disposed more inwardly of the bending portion than is a side surface of the second support film.

12. The display device of claim 3, further comprising a display printed circuit board attached to the second flat portion, and a main circuit board electrically connecting the display printed circuit board to the touch printed circuit board.

13. The display device of claim 1, wherein the first indent pattern is a groove containing no solid and indented inwardly of the bending portion in a direction opposite to the bending portion such that a bending stress of the display panel can be decreased when an external impact occurs.

14. A display device comprising:
a display panel including a flexible substrate having a display surface, the flexible substrate including a first flat portion, a second flat portion disposed to overlap the first flat portion in a thickness direction of the display device, and a bending portion between the first flat portion and the second flat portion;
a touch panel being disposed on the display panel, and including a pad side portion;
a touch printed circuit board including a first attachment portion attached to a first surface of the pad side portion; and
in the thickness direction, a first support film disposed to overlap the first flat portion, and a second support film disposed to overlap the second flat portion,
wherein the first support film includes a first indent pattern which is indented inwardly of the bending portion and from a remaining portion of the first support film,
the first flat portion of the substrate is disposed between the first support film and the touch panel,
the touch printed circuit board is bent in a direction opposite to the display surface to cover the bonding portion,
the display device further comprises a first bending stress relieving layer covering a lower surface of the first attachment portion exposed by the touch panel,
an optical film disposed between the touch panel and the flexible substrate;
a bending protective film disposed on a side of the optical film to cover the bending portion,
the first support film is disposed to overlap at least a portion of each of the bending protective film and the optical film,
the touch printed circuit board includes first attachment portions and the first support film includes first indent patterns respectively disposed to overlap the first attachment portions,
touch printed circuit board further includes a second attachment portion attached to a second surface of the pad side portion, and disposed between the first attachment portions.

15. The display device of claim 14, wherein the first support film includes a second indent pattern disposed to overlap the second attachment portion in the thickness direction, the second indent pattern being indented inwardly of the bending portion and from a remaining portion of the first support film.

16. The display device of claim 15, further comprising a second bending stress relieving layer covering a surface of the second attachment portion exposed by the touch panel.

17. A display device, comprising:
a display panel including a flexible substrate including a first flat portion, a second flat portion disposed to overlap the first flat portion in a thickness direction of the display device, and a bending portion between the first flat portion and the second flat portion;
a touch panel disposed on the display panel;
a cover window disposed on the touch panel; and
a first support film disposed to overlap the first flat portion, and a second support film disposed to overlap the second flat portion and to face the first support film, wherein
when viewed in a plan view, an end portion of the first support film includes at least one indent pattern disposed beyond a boundary between the bending portion and the first flat portion,
the first flat portion of the substrate is disposed between the first support film and the touch panel,
the display device further comprises a bracket attached to the cover window to cover lower and side surfaces of be display panel and the touch panel,
the bracket includes at least one protrusion portion protruding toward the touch panel, and the at least one indent pattern is disposed to overlap the at least one protrusion portion.

18. The display device of claim 17, further comprising:
an optical film disposed between the touch panel and the flexible substrate; and
a protective film disposed on a side of the optical film to cover the bending portion,
wherein the first support film is disposed to overlap at least a portion of each of the protective film and the optical film.

19. The display device of claim 18, wherein the first support film and the second support film face each other, and
the display device further comprises a bonding layer disposed between the first support film and the second support film.

20. A display device comprising:
a display panel including a flexible substrate having a display surface, the flexible substrate including a first flat portion, a second flat portion disposed to overlap the first flat portion in a thickness direction of the display device, and a bending portion between the first flat portion and the second flat portion;
a cover window disposed on the display panel; and
in the thickness direction, a first support film disposed to overlap the first flat portion, and a second support film disposed to overlap the second flat portion, wherein
the first support film includes a first indent pattern which is indented inwardly of the bending portion and from a remaining portion of the first support film, and
when the substrate is not bent, the first flat portion of the substrate is disposed between the first support film and the cover window.

21. The display device of claim 20, further comprising:
a touch panel being disposed on the display panel, and including a pad side portion; and
a touch printed circuit board including a first attachment portion attached to a surface of the pad side portion.

22. The display device of claim 21, wherein the first indent pattern overlaps the first attachment portion in the thickness direction.

23. A display device, comprising:
a display panel including a flexible substrate including a first flat portion, a second flat portion disposed to overlap the first flat portion in a thickness direction of the display device, and a bending portion between the first flat portion and the second flat portion;
a touch panel disposed on the display panel;
a cover window disposed on the touch panel; and
a first support film disposed to overlap the first flat portion, and a second support film disposed to overlap the second flat portion and to face the first support film, wherein
when viewed in a plan view, an end portion of the first support film includes at least one indent pattern disposed beyond a boundary between the bending portion and the first flat portion, and
when the substrate is not bent, the first flat portion of the substrate is disposed between the first support film and the touch panel.

24. The display device of claim 23, further comprising a bracket attached to the cover window to cover lower and side surfaces of the display panel and the touch panel.

* * * * *